United States Patent
Gopal et al.

(10) Patent No.: US 10,128,868 B1
(45) Date of Patent: Nov. 13, 2018

(54) EFFICIENT DICTIONARY FOR LOSSLESS COMPRESSION

(71) Applicant: Intel Corporation, Santa Clara, CA (US)

(72) Inventors: Vinodh Gopal, Westborough, MA (US); James D. Guilford, Northborough, MA (US); Yen-Kuang Chen, Franklink Park, NJ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/858,964

(22) Filed: Dec. 29, 2017

(51) Int. Cl.
*H03M 7/34* (2006.01)
*H03M 7/30* (2006.01)

(52) U.S. Cl.
CPC .................. *H03M 7/3088* (2013.01)

(58) Field of Classification Search
CPC ........ H03M 7/3088; H03M 7/30; H03M 7/42; H03M 7/00; H03M 5/00
USPC ............................................. 341/50, 51, 106
See application file for complete search history.

(56) References Cited

U.S. PATENT DOCUMENTS

| | | | | |
|---|---|---|---|---|
| 5,951,623 A * | 9/1999 | Reynar | .................... | G06T 9/005 341/106 |
| 7,477,166 B2 * | 1/2009 | McCanne | ................ | H03M 7/30 341/50 |
| RE41,152 E * | 2/2010 | Reynar | .................... | G06T 9/005 341/106 |
| 7,860,843 B2 * | 12/2010 | Dodd | ...................... | H03M 7/30 707/693 |
| 8,400,334 B2 * | 3/2013 | Lee | ..................... | H03M 7/6052 341/51 |
| 8,633,838 B2 * | 1/2014 | Falls | ................... | H03M 7/3086 341/51 |
| 9,015,429 B2 * | 4/2015 | Li | ......................... | G11C 7/1036 711/154 |
| 9,479,383 B2 * | 10/2016 | Bhaskar | ............... | H03M 7/3088 |
| 2006/0106870 A1 * | 5/2006 | Franaszek | ........... | H03M 7/3088 |
| 2007/0018858 A1 * | 1/2007 | McCanne | ............... | H03M 7/30 341/50 |
| 2011/0158307 A1 * | 6/2011 | Lee | ..................... | H03M 7/3088 375/240 |

(Continued)

OTHER PUBLICATIONS

Alakuijala, J, et al., "Brotli Compressed Data Format", Internet Engineering Task Force (IETF) Google, (Jul. 2016), 128 pgs.

*Primary Examiner* — Jean B Jeanglaude
(74) *Attorney, Agent, or Firm* — Schwegman Lundberg & Woessner, P.A.

(57) ABSTRACT

Various systems and methods for lossless data compression are described herein. A process for lossless data compression includes hashing an input byte stream to produce a hash key; identifying a set of dictionary entries in a hash table using the hash key, the hash key associated with a word from a compact dictionary; identifying a set of candidate words from the compact dictionary based on the identified set of dictionary entries, the compact dictionary being a subset of a standard dictionary; determining a best match of the set of candidate words with the input byte stream; and encoding the best match of the set of candidate words as a compressed output of the input byte stream, the encoding including an operation to determine an index into the standard dictionary of the best match and using the index in the encoding operation.

25 Claims, 19 Drawing Sheets

(56) References Cited

U.S. PATENT DOCUMENTS

2014/0149605 A1* 5/2014 Annamalaisami .. H03M 7/3088
709/247
2014/0325088 A1* 10/2014 Bhaskar .............. H03M 7/3088
709/231

* cited by examiner

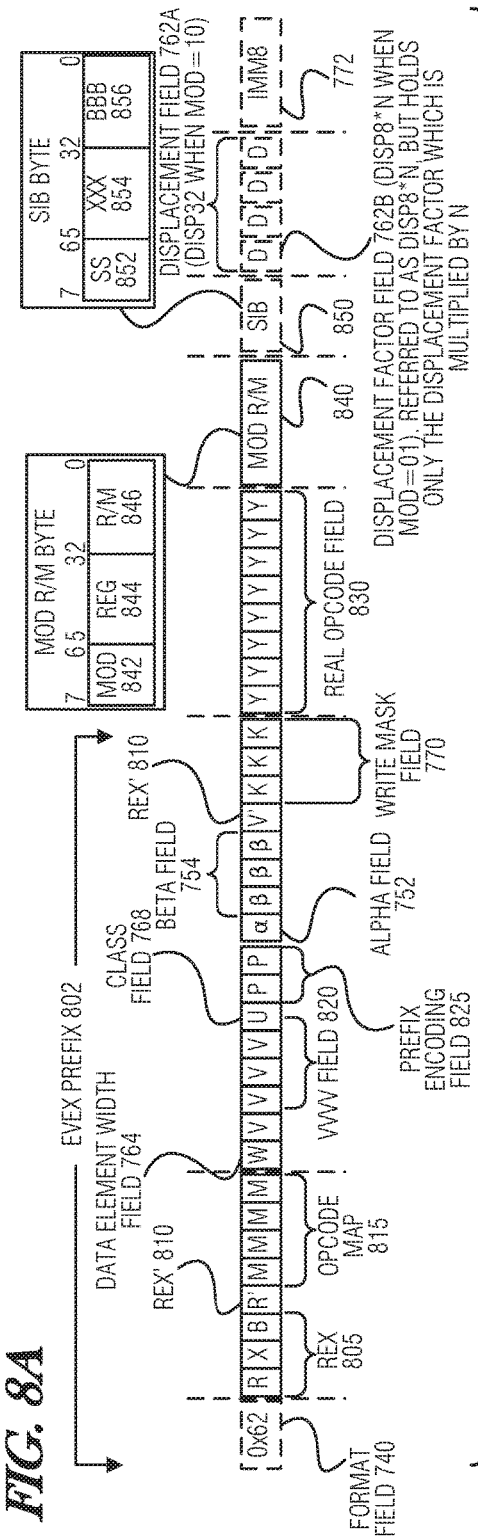
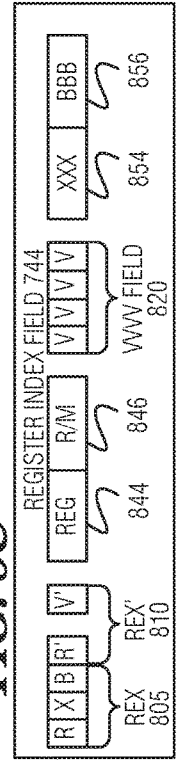
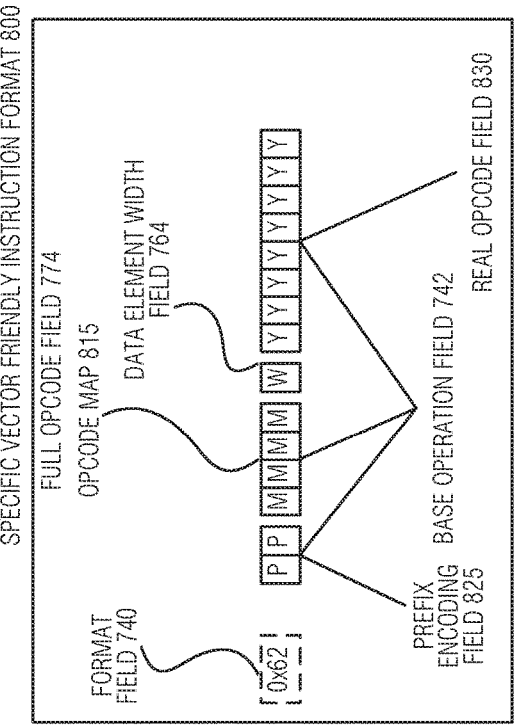

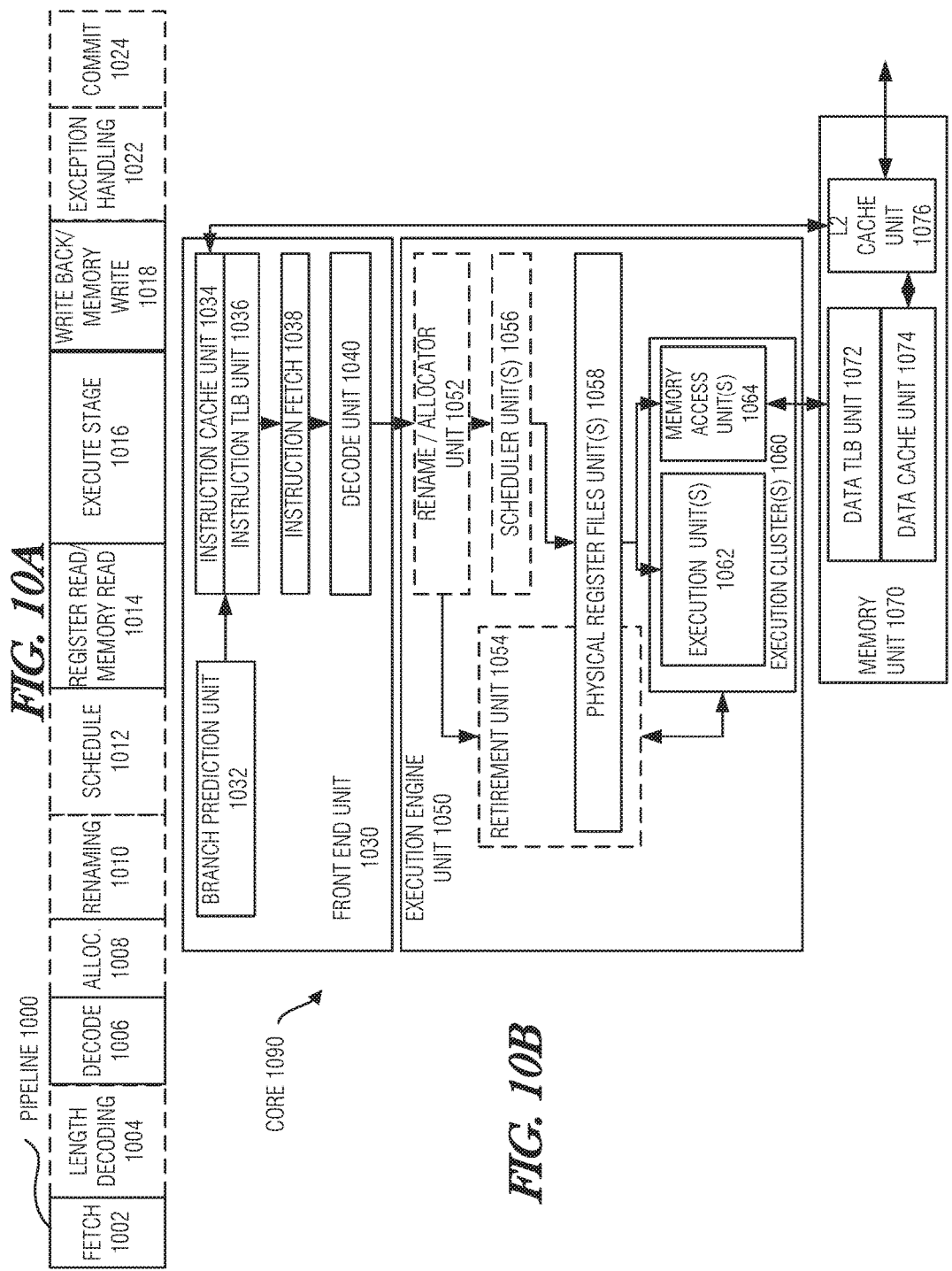

US 10,128,868 B1

EFFICIENT DICTIONARY FOR LOSSLESS COMPRESSION

TECHNICAL FIELD

Embodiments described herein generally relate to data compression, and in particular, to systems and methods for efficient dictionary use for lossless compression.

BACKGROUND

Lossless compression is a type of data compression in which the original data may be perfectly reconstructed from the compressed data. This type of compression is used in situations where maintaining the original data in its original form is important. There are several challenges with lossless compression including maintaining reasonable resource use, minimizing memory usage, and reducing processing time.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIGS. 8A-8D are block diagrams illustrating a specific vector friendly instruction format according to an embodiment;

FIG. 10A is a block diagram illustrating both an in-order pipeline and a register renaming, out-of-order issue/execution pipeline according to an embodiment;

FIG. 10B is a block diagram illustrating both an in-order architecture core and a register renaming, out-of-order issue/execution architecture core to be included in a processor according to an embodiment;

DETAILED DESCRIPTION

In the following description, for purposes of explanation, numerous specific details are set forth in order to provide a thorough understanding of some example embodiments. It will be evident, however, to one skilled in the art that the present disclosure may be practiced without these specific details.

Brotli is an example of a lossless compression algorithm. Brotli uses a 128 kilobyte (KB) dictionary. Encoding a string involves first looking at a history buffer to see if there is a match. When there is no match in the history buffer, the string is hashed and a hash table is used to search the dictionary. If there is a match in the dictionary, the string is encoded with the dictionary words so as to reduce the number of bits used to encode the string.

With the 128 KB dictionary and an additional 64 KB hash index, the Brotli implementation consumes a significant amount of memory space. Systems and methods described in this document propose the use of a smaller (e.g., 16 KB) dictionary and a smaller (e.g., 8 KB) hash index. Based on real-world results, the innovative techniques described here suffer minor degradation in compression versus the standard Brotli implementation.

In particular, this document describes an efficient hardware accelerator design that reduces the size of a predefined dictionary in lossless compression with minimal degradation in compression ratios. Beginning with a full 128 KB dictionary, string usage is profiled and the most-frequently used words are identified. This may be the top 10% for instance. These most-frequently used words are repackaged into a 16 KB data structure (e.g., compact dictionary). Furthermore, these words are stored in the compact dictionary with an associated index to the standard dictionary. When words are found in the compact dictionary, the associated index to the standard dictionary is encoded in the compressed output, thereby allowing a conventional Brotli decompression algorithm to decompress the compressed output. The result is a much more efficient hardware design of the dictionary (e.g., ⅛ of the original size) with minimal amount of degradation in compression ratio (e.g., tested results indicating approximately 0.2% degradation). As such, more compression engines may be packed into silicon, providing higher overall throughput with additional engines or optimizing for area growth of the die with similar performance as the conventional implementation.

Figure 1:
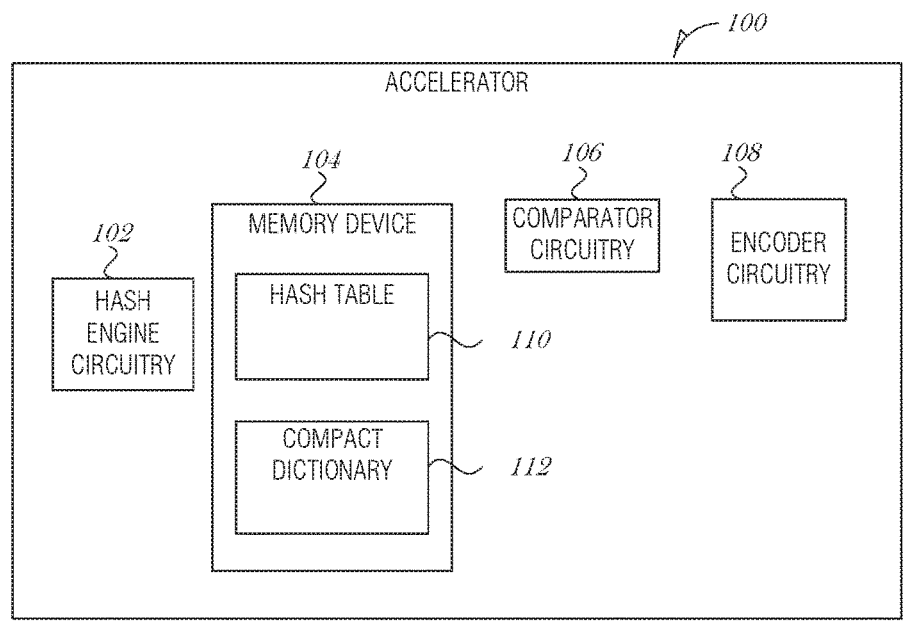
FIG. 1 is a block diagram illustrating an implementation of a hardware accelerator, according to an embodiment.

FIG. 1 is a block diagram illustrating an implementation of a hardware accelerator 100, according to an embodiment. The hardware accelerator 100 may be an accelerator implemented within a system, such as system 1300 of FIG. 13 or system 1400 of FIG. 14, for example. The hardware accelerator 100 may be an instance of a coprocessor 1315 of FIG. 13 or a processor 1415 of FIG. 14, in various embodiments. In general it is understood that the hardware accelerator 100 may be one or more integrated circuitry implemented to work with a main processor core to compress data using the improved mechanisms described here.

The accelerator 100 includes hash engine circuitry 102, memory device 104, comparator circuitry 106, and encoder circuitry 108. The memory device 104 includes a group of hash tables 110 and a corresponding group of compact dictionaries 112. There may be one or more hash engines implemented in the hash engine circuitry 102, with each hash engine corresponding to a hash table 110 and compact dictionary 112. Thus, there may be one or more hash tables 110, and one or more compact dictionaries 112 that correspond to each of the hash tables 110.

Although one memory device 104 is illustrated in FIG. 1, it is understood that the hash tables 110 and compact dictionaries 112 may be stored on one memory device, or across several memory devices. Thus, memory device 104 refers to one or more memory devices.

The hash engine circuitry 102 implements a group of hash engines (e.g., one or more hash engines), to perform respect hash functions on an input byte stream. The hash engines implemented by the hash engine circuitry 102 produce a hash result, which is used to lookup a corresponding compact dictionary entry in the hash table 110. Each hash engine implemented by the hash engine circuitry 102 has a corresponding hash table 110 and uses that hash table 110 to determine one or more compact dictionary entries that may match the input byte stream being processed by the hash engine.

The group of compact dictionaries 112 include multiple words, with each word having a specific distance into the compact dictionary 112. The compact dictionaries 112 are a subset of a standard dictionary (e.g., the Brotli dictionary).

The compact dictionary entries identified via the hash engine circuitry 102 and corresponding hash tables 110 are processed by the comparator circuitry 106. The comparator circuitry 106 may be used to implement a group of one or more comparator circuits, each comparator circuit associated with a respective hash engine implemented by hash engine circuitry 102. The comparator circuitry 106 is used to compare a word or words identified from a compact dictionary 112 with the input byte stream and create a match score. The match score is indicative of how well the word identified in the hash table matches the input byte stream. The comparator circuitry 106 then identifies a selected word based on the best match.

The encoder circuitry 108 is used to encode the selected word from the respective compact dictionary 112 by determining an index into a standard dictionary (e.g., the Brotli dictionary) of the selected word, and using that index when encoding the selected word in an output stream.

Figure 2:
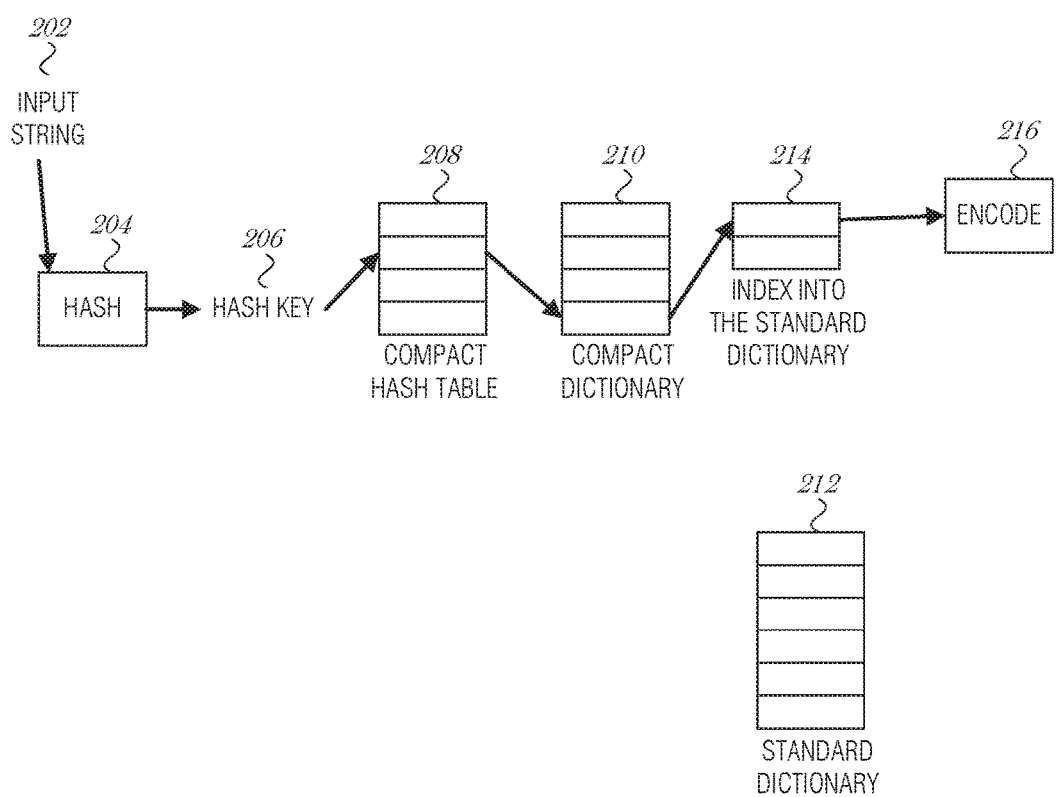
FIG. 2 is a diagram illustrating an improved implementation of lossless compression, according to an embodiment.

FIG. 2 is a diagram illustrating an improved implementation 200 of lossless compression, according to an embodiment. In the improved implementation 100, an input string 202 is hashed with a hash function (operation 104), resulting in a hash key 106. This hash key 206 is used with a compact hash table 108 to determine whether there are any possible matches in a compact dictionary 110. If there is a match, or multiple matches, then the matches are evaluated to determine a best match. The compact dictionary index of the best match is then used to determine an index into a standard dictionary 212. The standard dictionary index 114 may then be encoded into the output (encode operation 116). The encode operation 216 may be the same or substantially similar to an encode operation used in a standard Broth processing because the standard dictionary index 214 from the standard dictionary 210 is encoded. The encode operation 216 may account for slight mismatches between the input string 202 and the dictionary entry, encoding a variant of the input string 202 with additional information indicating how the dictionary entry is modified to recover the input string. The encode operation 216 may also encode the input string 202 as a literal when the input string 202 is not found in the standard dictionary 212. Other operations may be performed in the encode operation 216, which are not described here.

To maintain decompression compatibility with conventional Broth installations, the standard dictionary index is encoded in the output. The association between the compact dictionary index and the standard dictionary index may be stored in the compact hash table 108. In another embodiment, the standard dictionary index is stored in a separate lookup data structure (e.g., a mapping table). The separate lookup data structure may only have mappings between the compact dictionary indices and the standard dictionary indices.

Figure 3:
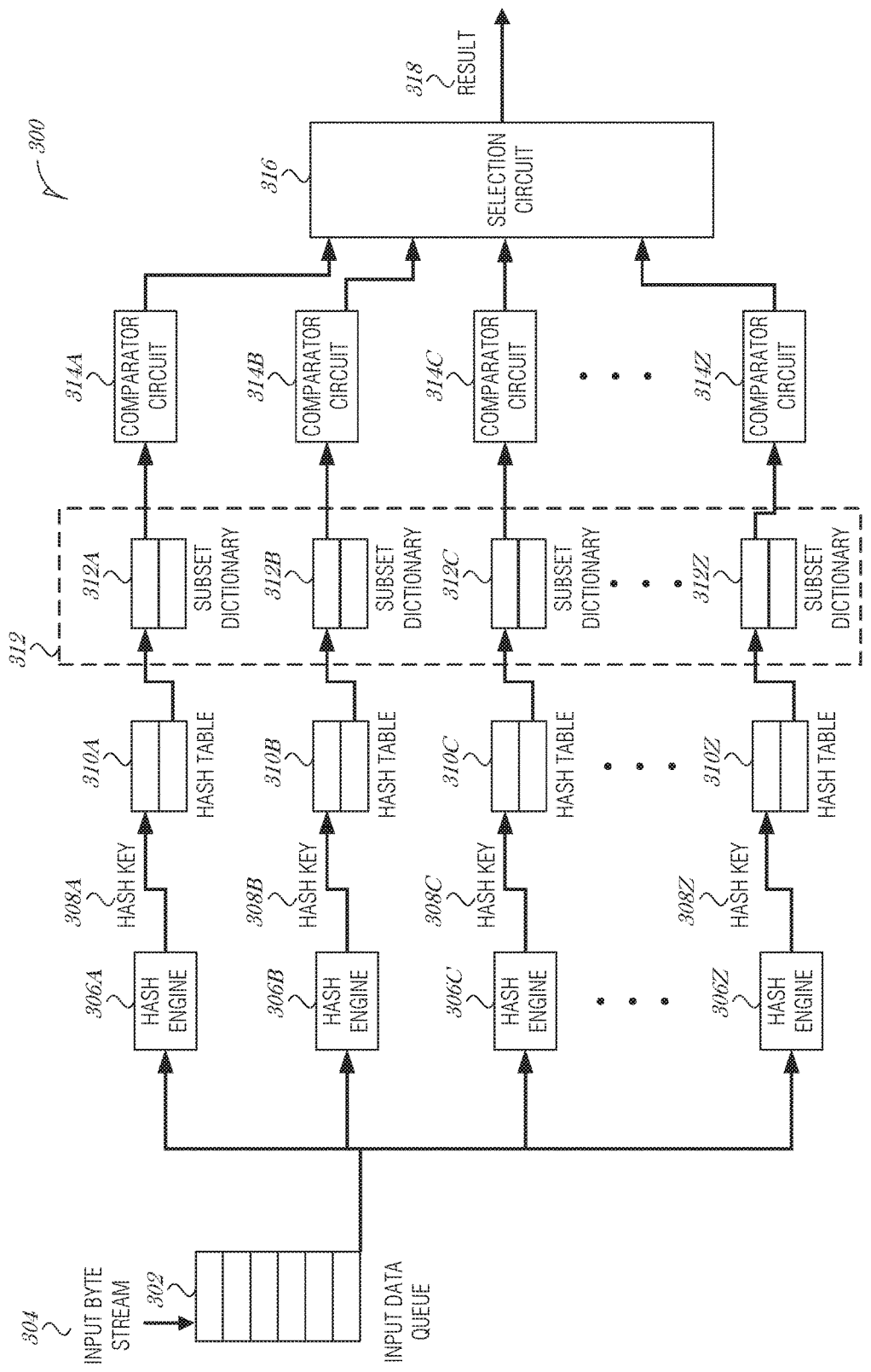
FIG. 3 is a block diagram illustrating an implementation, according to an embodiment.

FIG. 3 is a block diagram illustrating an implementation 300, according to an embodiment. An input data queue 302 is used to buffer an input byte stream 304. Multiple hash engines 306A, 306B, 306C, . . . , 306Z (collectively referred to as 306) are used to process data from the input data queue 302 in parallel. Each hash engine 306 is configured, programmed, or designed to process a specific word lengths. Hash engines 306 may be implemented using a field-programmable gate array (FPGA), application-specific integrated circuit (ASIC), or the like. The conventional Brotli static dictionary is used to store strings of 4 to 24 bytes. As such, in an embodiment, there are twenty-one hash engines 306, one for each possible word length from 4 to 24 bytes. In the example illustrated in FIG. 3, hash engine 306A processes a 4-byte string, hash engine 306B processes a 5-byte string, hash engine 306C processes a 6-byte string, etc., up to hash engine 306Z, which processes a 24-byte string. Thus, hash engine 306A may process the first four bytes from the input byte stream 304, hash engine 306B may process the first five bytes from the input byte stream 304, etc., up to hash engine 306Z, which processes the first twenty-four bytes from the input byte stream 304.

Each hash engine 306 hashes its n-byte string to produce a corresponding hash key 308A, 308B, 308C, . . . , 308Z (collectively referred to as 308). The hash key 308 is used in a corresponding hash table 310A, 310B, 310C, . . . , 310N (collectively referred to as 310) to determine locations of possible matches in a compact dictionary 312. The hash table 310 may include a mapping from a hash key 308 to a dictionary entry in the compact dictionary 312. Alternatively, the hash table 310 may include more than one entry from a given hash key to multiple dictionary entries.

In an embodiment, the hash engines 306 are configured to process variant words by processing truncations of the input byte stream to determine if a variant word exists in the corresponding hash table 310. By allowing for partial matches against truncated forms, the system is able to reduce the size of the compact dictionary. In some cases, if the system were to hash fewer bytes, then it could potentially find matches against the prefixes of the word.

For instance, if the input string was "LISTENERx" and was being processed by a 9-byte hash engine 306, the exact term "LISTENERx" would not be found. However, with by processing truncations of the input string, the term "LIST" (e.g., a 4-byte input) may produce a hash that finds a partial match of the term "LISTENING"—a 9-byte word in the hash table 310 of the 9-byte hash engine 306.

The compact dictionary 312 may be physically or logically segmented so that each hash engine 306 has its own portion of the compact dictionary 312. For instance, each hash engine 306 may have a corresponding hash table 310 and a corresponding subset dictionary (illustrated as 312A, 312B. 312C, . . . , 312Z). Further, the number of entries or the size of the subset dictionaries 312A-Z may vary among the hash engines 306. In an embodiment, each hash engine 306 is allotted the same the number of entries in the compact dictionary 312 (e.g., each subset dictionary 312A-Z has the same number of entries). In another embodiment, each hash engine 306 may have the same or different numbers of entries in the corresponding subset dictionary 312A-Z.

A source string is provided to each hash engine 306, a hash key 308 is generated, the hash key 308 is used in the hash table 310 to identify dictionary entries, and dictionary entries are compared at a corresponding comparator circuit 314A, 314B, 314C, ..., 314Z (collectively referred to as 314). The comparator circuits 314 are used to compare a dictionary entry identified by the hash key 308 with the n-byte string from the input byte stream 302 that is being processed.

In an embodiment, each comparator circuit 314 may be configured, programmed, or adapted to process the identified n-word results from the corresponding subset dictionary 312A-Z. The comparator circuits 314 produce a score of how well the n-word matches the dictionary entry. A selection circuit 316 is used to determine the highest score of the comparisons and select the best match between a dictionary entry and an n-word from the comparator circuits 314. The selection circuit 316 outputs the result 318, which is then encoded. The result 318 may indicate that there was a match or no match, and if there was a match, then the length and offset values for the Brotli dictionary. The result 318 is the selected word. The selection circuit 316 may reference a data store to obtain the length and offset values for the Brotli dictionary corresponding to the best match (e.g., selected word). The data store may be a separate mapping table or may be the hash table 310 corresponding to the best match.

Alternatively, the selection circuit 316 may include one or more arithmetic logic units (ALUs) to sequentially process the search results starting from the longest length (e.g., 24-byte word). The selection circuit 316 may wait for the comparator circuit 314Z to produce a result of whether there is a match or not, and then begin evaluating the match scores from the comparator circuit 314Z first and then moving to the comparator circuit of one less in length. In such an embodiment, when a match is found, further processing may be halted. This saves processing time and ensures the highest possible compression ratio.

Figure 4:
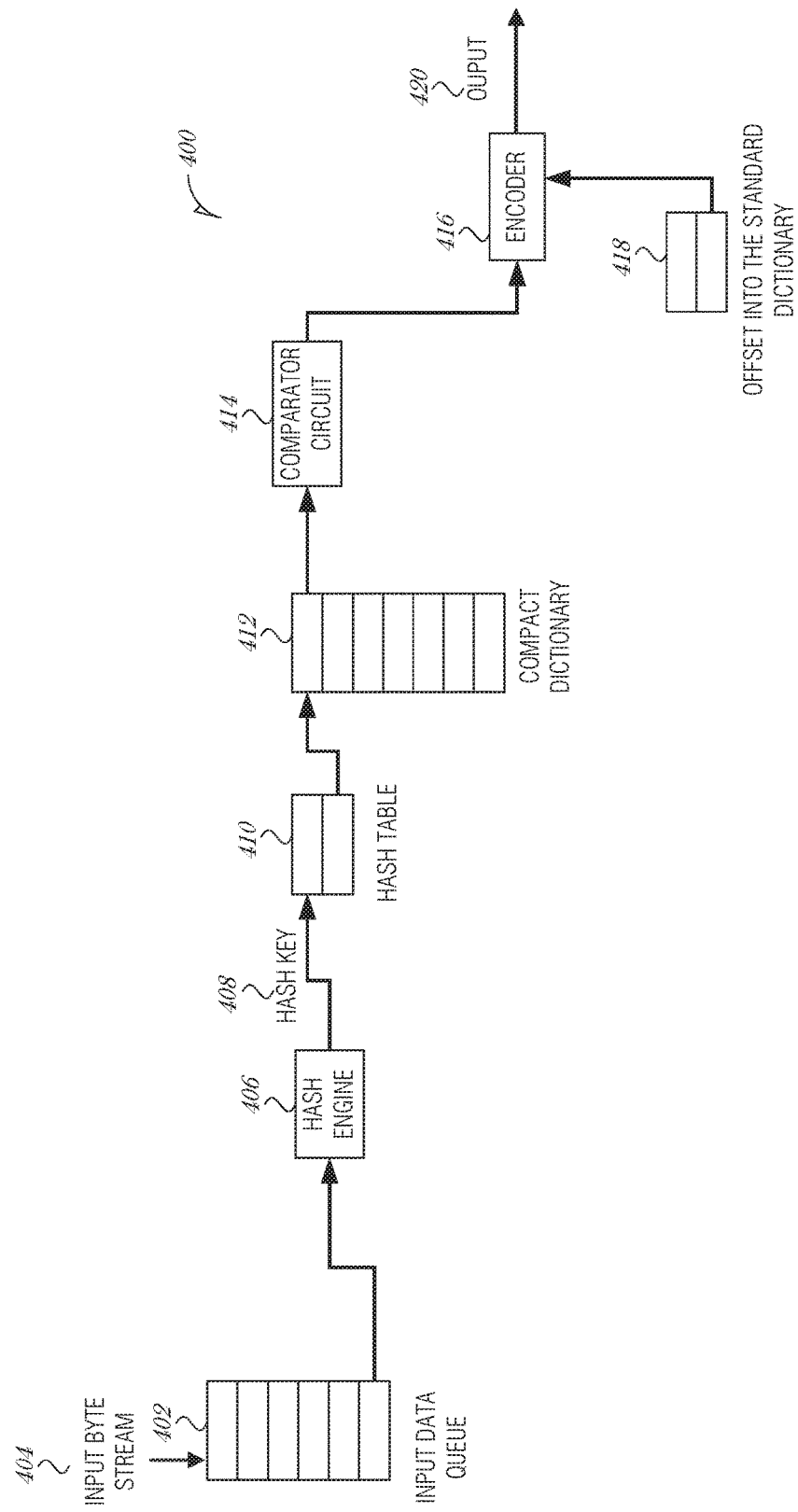
FIG. 4 is a block diagram illustrating an implementation, according to an embodiment.

FIG. 4 is a block diagram illustrating an implementation 400, according to an embodiment. An input byte stream 404 is received and buffered in an input data queue 402. A hash engine 406 is used to hash a portion of the input byte stream 404. The hash engine 406 may be implemented using a field-programmable gate array (FPGA), application-specific integrated circuit (ASIC), or the like. The hash engine 406 executes a hash function on the portion of the input byte stream 404 and produces a hash key 408. The hash key 408 is used to look up a corresponding entry in a hash table 410.

In contrast to the embodiment illustrated in FIG. 3, the hash table 410 is a single table that may be 16 KB. The hash table 410 includes records, each record having a hash key of a prefix string, a position in a compact dictionary 412 and a length of the string in the compact dictionary 412. In an embodiment, the record in the hash table 410 includes an offset into a standard dictionary for the particular position in the compact dictionary 412. Using the hash key 408, the position(s) of candidate strings are determined from the hash table record. The length of the string in the compact dictionary 412 is used to identify the entire candidate word stored in the compact dictionary 412.

The prefix string is of a fixed length. In an embodiment, the prefix string is 4 bytes long. The hash table 410 provides mappings from each 4-byte string to one or more candidate words in the compact dictionary 412. For instance, the prefix string of "them" may correspond to candidate words in the compact dictionary 412 of "them," "themselves," and "theme." The hash table 410 for this example prefix of "them" would have three entries, one for each of the words found in the compact dictionary 412.

On first use, the hash table 410 is populated from the compact dictionary 412. The hash table is not updated at every byte position of the 16 KB memory, but rather only at the byte positions that correspond to the start of a word in the compact dictionary 412. After the compact dictionary 412 is processed, the hash table 410 will contain a mapping from a 4-byte prefix string to one or more candidate words in the compact dictionary 412. When the dictionary is loaded for another job, the hash table 410 contents may be copied directly, bypassing the process of generating the hash table 410.

As portions of the input byte stream 404 are processed by the hash engine 406, a comparator circuit 414 is used to check the portion of the input byte stream 404 with the candidate words from the compact dictionary 412 to find the best match. The best match is often the longest word of the candidate words.

Referring back to the hash table 410, the entry with the best match is processed by an encoder 416 to obtain the offset into the standard dictionary 418. This offset, sometimes referred to as a distance, into the standard dictionary is encoded in the compressed output 420. Using the standard dictionary offset allows the receiver to decode and decompress the output 420 with a conventional Brotli installation.

Figure 5:
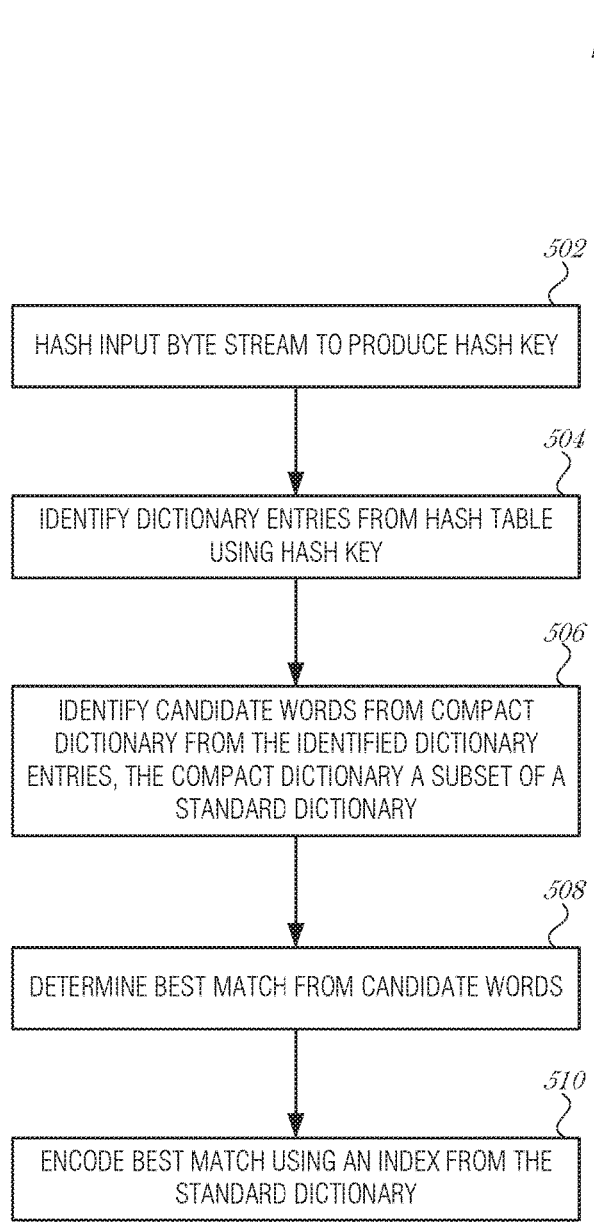
FIG. 5 is a flowchart illustrating a method for lossless data compression, according to an embodiment.

FIG. 5 is a flowchart illustrating a method 500 for lossless data compression, according to an embodiment. At 502, an input byte stream is hashed to produce a hash key. In an embodiment, hashing the input byte stream is performed by a plurality of hash engines operating in parallel, each of the plurality of hash engines to perform their respective hashes on a portion of the input byte stream.

In a further embodiment, each respective hash engine performs their respective hashes on an incrementally larger portion of the input byte stream.

In a related embodiment, the plurality of hash engines comprises twenty-one hash engines, and the hash engines are configured to operate on byte lengths in the range of four to twenty-four from the input byte stream.

At 504, a set of dictionary entries is identified in a hash table using the hash key, the hash key associated with a word from a standard dictionary. The set of dictionary entries may be one or more entries. In an embodiment, the standard dictionary is a Brotli dictionary.

At 506, a set of candidate words is identified from a compact dictionary based on the identified set of dictionary entries, the compact dictionary being a subset of the standard dictionary. In an embodiment, the compact dictionary comprises multiple subset dictionaries, each subset dictionary including words of a specific length, the specific length corresponding to a hash engine from the plurality of hash engines that is configured to operate on a string of the specific length.

At 508, a best match of the set of candidate words with the input byte stream is determined. In an embodiment, determining the best match comprises evaluating the plurality of candidate words from longest to shortest, and terminating the evaluation when the best match is found.

At 510, the best match of the set of candidate words is encoded as a compressed output of the input byte stream, the encoding including an operation to determine an index into the standard dictionary of the best match and using the index in the encoding operation.

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine (e.g., a computer). For example, a machine-readable storage device may include read-only memory (ROM), random-access memory (RAM), magnetic disk storage media, optical storage media, flash-memory devices, and other storage devices and media.

A processor subsystem may be used to execute the instruction on the machine-readable medium. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Examples, as described herein, may include, or may operate on, logic or a number of components, modules, or mechanisms. Modules may be hardware, software, or firmware communicatively coupled to one or more processors in order to carry out the operations described herein. Modules may be hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Circuitry or circuits, as used in this document, may comprise, for example, singly or in any combination, hard-wired circuitry, programmable circuitry such as computer processors comprising one or more individual instruction processing cores, state machine circuitry, and/or firmware that stores instructions executed by programmable circuitry. The circuits, circuitry, or modules may, collectively or individually, be embodied as circuitry that forms part of a larger system, for example, an integrated circuit (IC), system on-chip (SoC), desktop computers, laptop computers, tablet computers, servers, smart phones, etc.

As used in any embodiment herein, the term "logic" may refer to firmware and/or circuitry configured to perform any of the aforementioned operations. Firmware may be embodied as code, instructions or instruction sets and/or data that are hard-coded (e.g., nonvolatile) in memory devices and/or circuitry.

Figure 6:
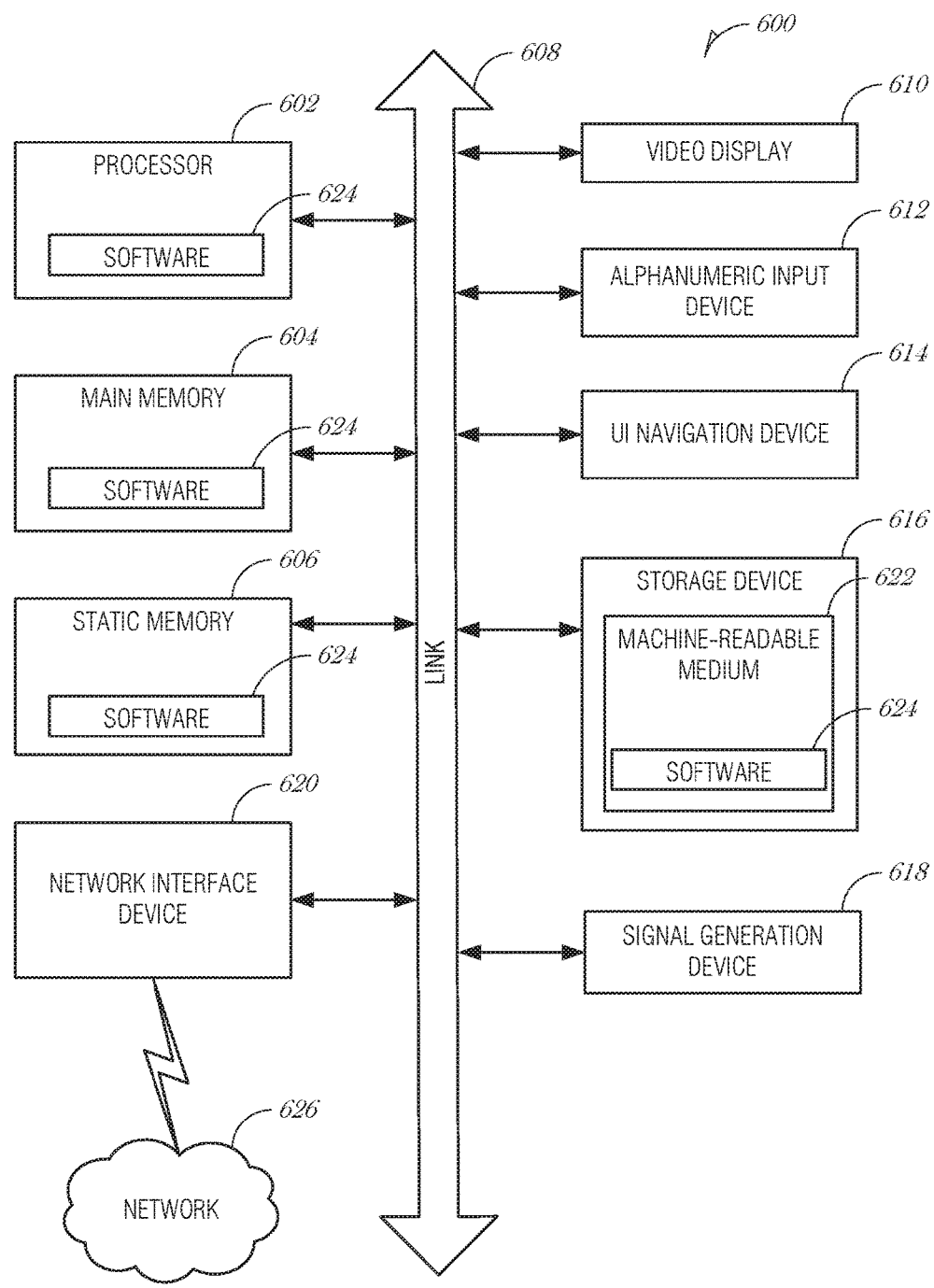
FIG. 6 is a block diagram illustrating an example machine upon which any one or more of the techniques (e.g., methodologies) discussed herein may perform, according to an embodiment.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processor circuitry executing code and/or instructions sets (e.g., software, firmware, etc.) corresponding to the functionality described herein, thus transforming a general-purpose processor into a specific-purpose processing environment to perform one or more of the operations described herein. In some embodiments, the processor circuitry 402 may be embodied as a stand-alone integrated circuit or may be incorporated as one of several components on an integrated circuit. In some embodiments, the various components and circuitry of the node 400 or other systems may be combined in a system-on-a-chip (SoC) architecture FIG. 6 is a block diagram illustrating a machine in the example form of a computer system 600, within which a set or sequence of instructions may be executed to cause the machine to perform any one of the methodologies discussed herein, according to an embodiment. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be a head-mounted display, wearable device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example computer system 600 includes at least one processor 602 (e.g., a central processing unit (CPU), a graphics processing unit (GPU) or both, processor cores, compute nodes, etc.), a main memory 604 and a static memory 606, which communicate with each other via a link 608 (e.g., bus). The computer system 600 may further include a video display unit 610, an alphanumeric input device 612 (e.g., a keyboard), and a user interface (UI) navigation device 614 (e.g., a mouse). In one embodiment, the video display unit 610, input device 612 and UI navigation device 614 are incorporated into a touch screen display. The computer system 600 may additionally include a storage device 616 (e.g., a drive unit), a signal generation device 618 (e.g., a speaker), a network interface device 620, and one or more sensors (not shown), such as a global positioning system (GPS) sensor, compass, accelerometer, gyrometer, magnetometer, or other sensor.

The storage device 616 includes a machine-readable medium 622 on which is stored one or more sets of data structures and instructions 624 (e.g., software) embodying or utilized by any one or more of the methodologies or functions described herein. The instructions 624 may also reside, completely or at least partially, within the main memory 604, static memory 606, and/or within the processor 602 during execution thereof by the computer system 600, with the main memory 604, static memory 606, and the processor 602 also constituting machine-readable media.

While the machine-readable medium 622 is illustrated in an example embodiment to be a single medium, the term "machine-readable medium" may include a single medium or multiple media (e.g., a centralized or distributed database, and/or associated caches and servers) that store the one or more instructions 624. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include nonvolatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 624 may further be transmitted or received over a communications network 626 using a transmission medium via the network interface device 620 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Bluetooth, Wi-Fi, 3G, and 4G LTE/LTE-A, 5G, DSRC, or WiMAX networks). The term "transmission medium" shall be taken to include any intangible medium that is capable of storing, encoding, or carrying instructions for execution by the machine, and includes digital or analog communications signals or other intangible medium to facilitate communication of such software.

The figures below detail architectures and systems to implement embodiments of the above. In some embodiments, one or more hardware components and/or instructions described above are emulated as detailed below, or implemented as software modules.

Embodiments of the instruction(s) detailed above are embodied may be embodied in a "generic vector friendly instruction format" which is detailed below. In other embodiments, such a format is not utilized and another instruction format is used, however, the description below of the writemask registers, various data transformations (swizzle, broadcast, etc.), addressing, etc. is generally applicable to the description of the embodiments of the instruction(s) above. Additionally, systems, architectures, and pipelines are detailed below. Embodiments of the instruction(s) above may be executed on such systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Instruction Formats

Embodiments of the instruction(s) described herein may be embodied in different formats. Additionally, systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 7A:
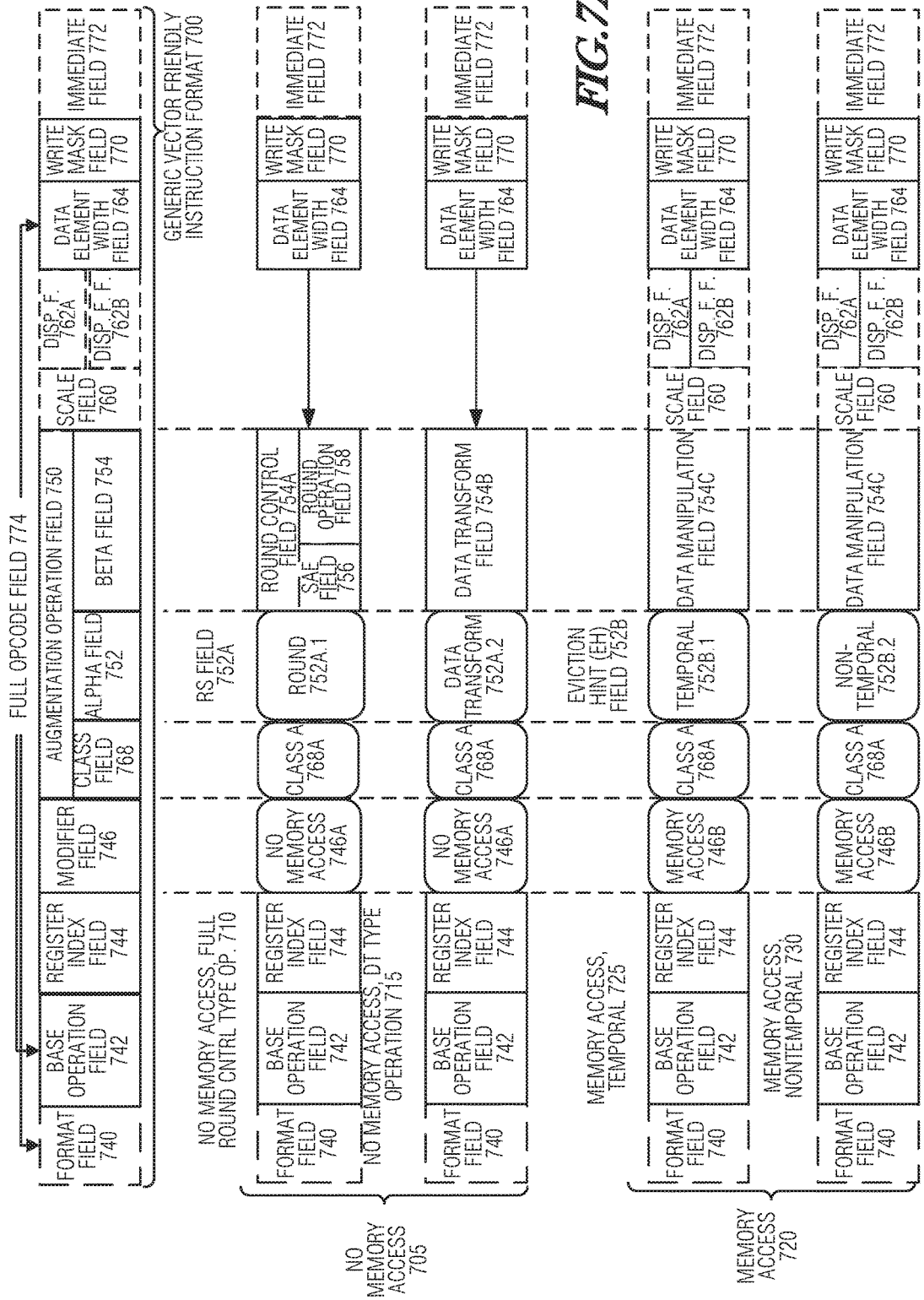
FIGS. 7A-7B are block diagrams illustrating a generic vector friendly instruction format and instruction templates thereof according to an embodiment.
Figure 7B:
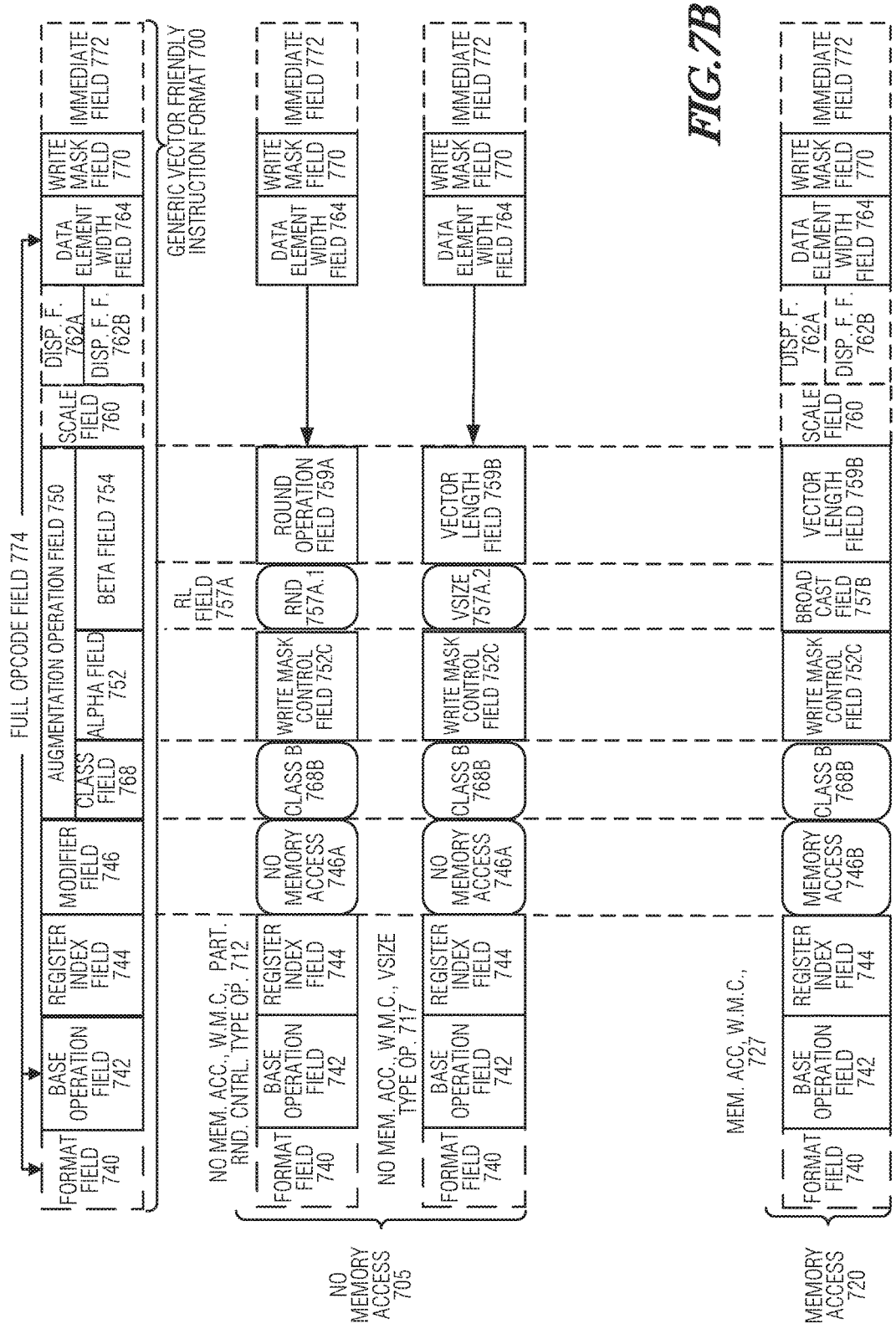

FIGS. 7A-7B are block diagrams illustrating a generic vector friendly instruction format and instruction templates thereof according to an embodiment. FIG. 7A is a block diagram illustrating a generic vector friendly instruction format and class A instruction templates thereof according to an embodiment; while FIG. 7B is a block diagram illustrating the generic vector friendly instruction format and class B instruction templates thereof according to an embodiment. Specifically, a generic vector friendly instruction format 700 for which are defined class A and class B instruction templates, both of which include no memory access 705 instruction templates and memory access 720 instruction templates. The term generic in the context of the vector friendly instruction format refers to the instruction format not being tied to any specific instruction set.

While embodiments will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 7A include: 1) within the no memory access 705 instruction templates there is shown a no memory access, full round control type operation 710 instruction template and a no memory access, data transform type operation 715 instruction template; and 2) within the memory access 720 instruction templates there is shown a memory access, temporal 725 instruction template and a memory access, non-temporal 730 instruction template. The class B instruction templates in FIG. 7B include: 1) within the no memory access 705 instruction templates there is shown a no memory access, write mask control partial round control type operation 712 instruction template and a no memory access, write mask control, vsize type operation 717 instruction template; and 2) within the memory access 720 instruction templates there is shown a memory access, write mask control 727 instruction template.

The generic vector friendly instruction format 700 includes the following fields listed below in the order illustrated in FIGS. 7A-7B.

Format field 740—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 742—its content distinguishes different base operations.

Register index field 744—its content, directly or through address generation, specifies the locations of the source and destination operands, be they in registers or in memory. These include a sufficient number of bits to select N registers from a P×Q (e.g., 32×512, 16×128, 32×1024, 64×1024) register file. While in an embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 746—its content distinguishes occurrences of instructions in the generic vector instruction format that specify memory access from those that do not; that is, between no memory access 705 instruction templates and memory access 720 instruction templates. Memory access operations read and/or write to the memory hierarchy (in some cases specifying the source and/or destination addresses using values in the registers), while non-memory access operations do not (e.g., the source and destinations are registers). While in an embodiment this field also selects between three different ways to perform memory address calculations, alternative embodiments may support more, less, or different ways to perform memory address calculations.

Augmentation operation field 750—its content distinguishes which one of a variety of different operations to be performed in addition to the base operation. This field is context specific. In an embodiment, this field is divided into a class field 768, an alpha field 752, and a beta field 754. The augmentation operation field 750 allows common groups of operations to be performed in a single instruction rather than 2, 3, or 4 instructions.

Scale field 760—its content allows for the scaling of the index field's content for memory address generation (e.g., for address generation that uses 2scale*index+base).

Displacement Field 762A—its content is used as part of memory address generation (e.g., for address generation that uses 2scale*index+base+displacement).

Displacement Factor Field 762B (note that the juxtaposition of displacement field 762A directly over displacement factor field 762B indicates one or the other is used)—its content is used as part of address generation; it specifies a displacement factor that is to be scaled by the size of a memory access (N)—where N is the number of bytes in the memory access (e.g., for address generation that uses 2scale*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 774 (described later herein) and the data manipulation field 754C. The displacement field 762A and the displacement factor field 762B are optional in the sense that they are not used for the no memory access 705 instruction templates and/or different embodiments may implement only one or none of the two.

Data element width field 764—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 770—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in another embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in an embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 770 allows for partial vector operations, including loads, stores, arithmetic, logical, etc. While embodiments are described in which the write mask field's 770 content selects one of a number of write mask registers that contains the write mask to be used (and thus the write mask field's 770 content indirectly identifies that masking to be performed), alternative embodiments instead or additional allow the mask write field's 770 content to directly specify the masking to be performed.

Immediate field 772—its content allows for the specification of an immediate. This field is optional in the sense that is it not present in an implementation of the generic vector friendly format that does not support immediate and it is not present in instructions that do not use an immediate.

Class field 768—its content distinguishes between different classes of instructions. With reference to FIGS. 7A-7B, the contents of this field select between class A and class B instructions. In FIGS. 7A-7B, rounded corner squares are used to indicate a specific value is present in a field (e.g., class A 768A and class B 768B for the class field 768 respectively in FIGS. 7A-7B).

Instruction Templates of Class A

In the case of the non-memory access 705 instruction templates of class A, the alpha field 752 is interpreted as an RS field 752A, whose content distinguishes which one of the different augmentation operation types are to be performed (e.g., round 752A.1 and data transform 752A.2 are respectively specified for the no memory access, round type operation 710 and the no memory access, data transform type operation 715 instruction templates), while the beta field 754 distinguishes which of the operations of the specified type is to be performed. In the no memory access 705 instruction templates, the scale field 760, the displacement field 762A, and the displacement scale filed 762B are not present.

No-Memory Access Instruction Templates—Full Round Control Type Operation

In the no memory access full round control type operation 710 instruction template, the beta field 754 is interpreted as a round control field 754A, whose content(s) provide static rounding. While in the described embodiments the round control field 754A includes a suppress all floating point exceptions (SAE) field 756 and a round operation control field 758, alternative embodiments may support may encode both these concepts into the same field or only have one or the other of these concepts/fields (e.g., may have only the round operation control field 758).

SAE field 756—its content distinguishes whether or not to disable the exception event reporting; when the SAE field's 756 content indicates suppression is enabled, a given instruction does not report any kind of floating-point exception flag and does not raise any floating point exception handler.

Round operation control field 758—its content distinguishes which one of a group of rounding operations to perform (e.g., Round-up, Round-down. Round-towards-zero and Round-to-nearest). Thus, the round operation control field 758 allows for the changing of the rounding mode on a per instruction basis. In an embodiment where a processor includes a control register for specifying rounding modes, the round operation control field's 750 content overrides that register value.

No Memory Access Instruction Templates—Data Transform Type Operation

In the no memory access data transform type operation 715 instruction template, the beta field 754 is interpreted as a data transform field 754B, whose content distinguishes which one of a number of data transforms is to be performed (e.g., no data transform, swizzle, broadcast).

In the case of a memory access 720 instruction template of class A, the alpha field 752 is interpreted as an eviction hint field 752B, whose content distinguishes which one of the eviction hints is to be used (in FIG. 7A, temporal 752B.1 and non-temporal 752B.2 are respectively specified for the memory access, temporal 725 instruction template and the memory access, non-temporal 730 instruction template), while the beta field 754 is interpreted as a data manipulation field 754C, whose content distinguishes which one of a number of data manipulation operations (also known as primitives) is to be performed (e.g., no manipulation; broadcast; up conversion of a source; and down conversion of a destination). The memory access 720 instruction templates include the scale field 760, and optionally the displacement field 762A or the displacement scale field 762B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 752 is interpreted as a write mask control (Z) field 752C, whose content distinguishes whether the write masking controlled by the write mask field 770 should be a merging or a zeroing.

In the case of the non-memory access 705 instruction templates of class B, part of the beta field 754 is interpreted as an RL field 757A, whose content distinguishes which one of the different augmentation operation types are to be performed (e.g., round 757A. 1 and vector length (VSIZE) 757A.2 are respectively specified for the no memory access, write mask control, partial round control type operation 712 instruction template and the no memory access, write mask control, VSIZE type operation 717 instruction template), while the rest of the beta field 754 distinguishes which of the operations of the specified type is to be performed. In the no memory access 705 instruction templates, the scale field 760, the displacement field 762A, and the displacement scale filed 762B are not present.

In the no memory access, write mask control, partial round control type operation 710 instruction template, the rest of the beta field 754 is interpreted as a round operation field 759A and exception event reporting is disabled (a given instruction does not report any kind of floating-point exception flag and does not raise any floating point exception handler).

Round operation control field 759A—just as round operation control field 758, its content distinguishes which one of a group of rounding operations to perform (e.g., Round-up, Round-down, Round-towards-zero and Round-to-nearest). Thus, the round operation control field 759A allows for the changing of the rounding mode on a per instruction basis. In an embodiment where a processor includes a control register for specifying rounding modes, the round operation control field's 750 content overrides that register value.

In the no memory access, write mask control VSIZE type operation 717 instruction template, the rest of the beta field 754 is interpreted as a vector length field 759B, whose content distinguishes which one of a number of data vector lengths is to be performed on (e.g., 128, 256, or 512 byte).

In the case of a memory access 720 instruction template of class B, part of the beta field 754 is interpreted as a broadcast field 757B, whose content distinguishes whether or not the broadcast type data manipulation operation is to be performed, while the rest of the beta field 754 is interpreted the vector length field 759B. The memory access 720 instruction templates include the scale field 760, and optionally the displacement field 762A or the displacement scale field 762B.

With regard to the generic vector friendly instruction format 700, a full opcode field 774 is shown including the format field 740, the base operation field 742, and the data element width field 764. While one embodiment is shown where the full opcode field 774 includes all of these fields, the full opcode field 774 includes less than all of these fields in embodiments that do not support all of them. The full opcode field 774 provides the operation code (opcode).

The augmentation operation field 750, the data element width field 764, and the write mask field 770 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Specific Vector Friendly Instruction Format

FIG. 8 is a block diagram illustrating a specific vector friendly instruction format according to an embodiment. FIG. 8 shows a specific vector friendly instruction format 800 that is specific in the sense that it specifies the location, size, interpretation, and order of the fields, as well as values for some of those fields. The specific vector friendly instruction format 800 may be used to extend the x86 instruction set, and thus some of the fields are similar or the same as those used in the existing x86 instruction set and extension thereof (e.g., AVX). This format remains consistent with the prefix encoding field, real opcode byte field. MOD R/M field, SIB field, displacement field, and immediate fields of the existing x86 instruction set with extensions. The fields from FIG. 7 into which the fields from FIG. 8 map are illustrated.

It should be understood that, although embodiments are described with reference to the specific vector friendly instruction format 800 in the context of the generic vector friendly instruction format 700 for illustrative purposes, the invention is not limited to the specific vector friendly instruction format 800 except where claimed. For example, the generic vector friendly instruction format 700 contemplates a variety of possible sizes for the various fields, while the specific vector friendly instruction format 800 is shown as having fields of specific sizes. By way of specific example, while the data element width field 764 is illustrated as a one bit field in the specific vector friendly instruction format 800, the invention is not so limited (that is, the generic vector friendly instruction format 700 contemplates other sizes of the data element width field 764).

The generic vector friendly instruction format 700 includes the following fields listed below in the order illustrated in FIG. 8A.

EVEX Prefix (Bytes 0-3) 802—is encoded in a four-byte form.

Format Field 740 (EVEX Byte 0, bits [7:0])—the first byte (EVEX Byte 0) is the format field 740 and it contains 0x62 (the unique value used for distinguishing the vector friendly instruction format in an embodiment).

The second-fourth bytes (EVEX Bytes 1-3) include a number of bit fields providing specific capability.

REX field 805 (EVEX Byte 1, bits [7-5])—consists of an EVEX.R bit field (EVEX Byte 1, bit [7]-R), EVEX.X bit field (EVEX byte 1, bit [6]-X), and 757BEX byte 1, bit [5]-B). The EVEX.R. EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 710—this is the first part of the REX' field 710 and is the EVEX.R' bit field (EVEX Byte 1, bit [4]-R') that is used to encode either the upper 16 or lower 16 of the extended 32 register set. In an embodiment, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments do not store this and the other indicated bits below in the inverted format. A value of 1 is used to encode the lower 16 registers. In other words, R'Rrrr is formed by combining EVEX.R'. EVEX.R, and the other RRR from other fields.

Opcode map field 815 (EVEX byte 1, bits [3:0]-mmmm)—its content encodes an implied leading opcode byte (0F, 0F 38, or 0F 3).

Data element width field 764 (EVEX byte 2, bit [7]-W)—is represented by the notation EVEX.W. EVEX.W is used to define the granularity (size) of the datatype (either 32-bit data elements or 64-bit data elements).

EVEX.vvvv 820 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 820 encodes the 4 low-order bits of the first source register specifier stored in inverted (1s complement) form. Depending on the instruction, an extra different EVEX bit field is used to extend the specifier size to 32 registers.

EVEX.U 768 Class field (EVEX byte 2, bit [2]-U)—If EVEX.U=0, it indicates class A or EVEX.U0; if EVEX.U=1, it indicates class B or EVEX.U1.

Prefix encoding field 825 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In an embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 752 (EVEX byte 3, bit [7]-EH; also known as EVEX.EH, EVEX.rs, EVEX.RL, EVEX.write mask control, and EVEX.N; also illustrated with α)—as previously described, this field is context specific.

Beta field 754 (EVEX byte 3, bits [6:4]-SSS, also known as EVEX.s2-0. EVEX.r2-0. EVEX.rr1, EVEX.LL0, EVEX.LLB; also illustrated with βββ)—as previously described, this field is context specific.

REX' field 710—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 770 (EVEX byte 3, bits [2:0]-kkk)—its content specifies the index of a register in the write mask registers as previously described. In an embodiment, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 830 (Byte 4) is also known as the opcode byte. Part of the opcode is specified in this field.

MOD R/M Field 840 (Byte 5) includes MOD field 842, Reg field 844, and R/M field 846. As previously described, the MOD field's 842 content distinguishes between memory access and non-memory access operations. The role of Reg field 844 can be summarized to two situations: encoding either the destination register operand or a source register operand, or be treated as an opcode extension and not used to encode any instruction operand. The role of R/M field 846 may include the following: encoding the instruction operand that references a memory address, or encoding either the destination register operand or a source register operand.

Scale, Index. Base (SIB) Byte (Byte 6)—As previously described, the scale field's 750 content is used for memory address generation. SIB.xxx 854 and SIB.bbb 856—the contents of these fields have been previously referred to with regard to the register indexes Xxxx and Bbbb.

Displacement field 762A (Bytes 7-10)—when MOD field 842 contains 10, bytes 7-10 are the displacement field 762A, and it works the same as the legacy 32-bit displacement (disp32) and works at byte granularity.

Displacement factor field 762B (Byte 7)—when MOD field 842 contains 01, byte 7 is the displacement factor field 762B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128. −64, 0, and 64; since a greater range is often needed, disp32 is used; however, disp32 requires 4 bytes. In contrast to disp8 and disp32, the displacement factor field 762B is a reinterpretation of disp8; when using displacement factor field 762B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 762B substitutes the legacy x86 instruction set 8-bit displacement. Thus, the displacement factor field 762B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 772 operates as previously described.

Full Opcode Field

FIG. 8B is a block diagram illustrating the fields of the specific vector friendly instruction format 800 that make up the full opcode field 774 according to an embodiment. Specifically, the full opcode field 774 includes the format field 740, the base operation field 742, and the data element width (W) field 764. The base operation field 742 includes the prefix encoding field 825, the opcode map field 815, and the real opcode field 830.

Register Index Field

FIG. 8C is a block diagram illustrating the fields of the specific vector friendly instruction format 800 that make up the register index field 744 according to an embodiment. Specifically, the register index field 744 includes the REX field 805, the REX' field 810, the MODR/M.reg field 844, the MODR/M.r/m field 846, the VVVV field 820, xxx field 854, and the bbb field 856.

Augmentation Operation Field

Figure 8D:
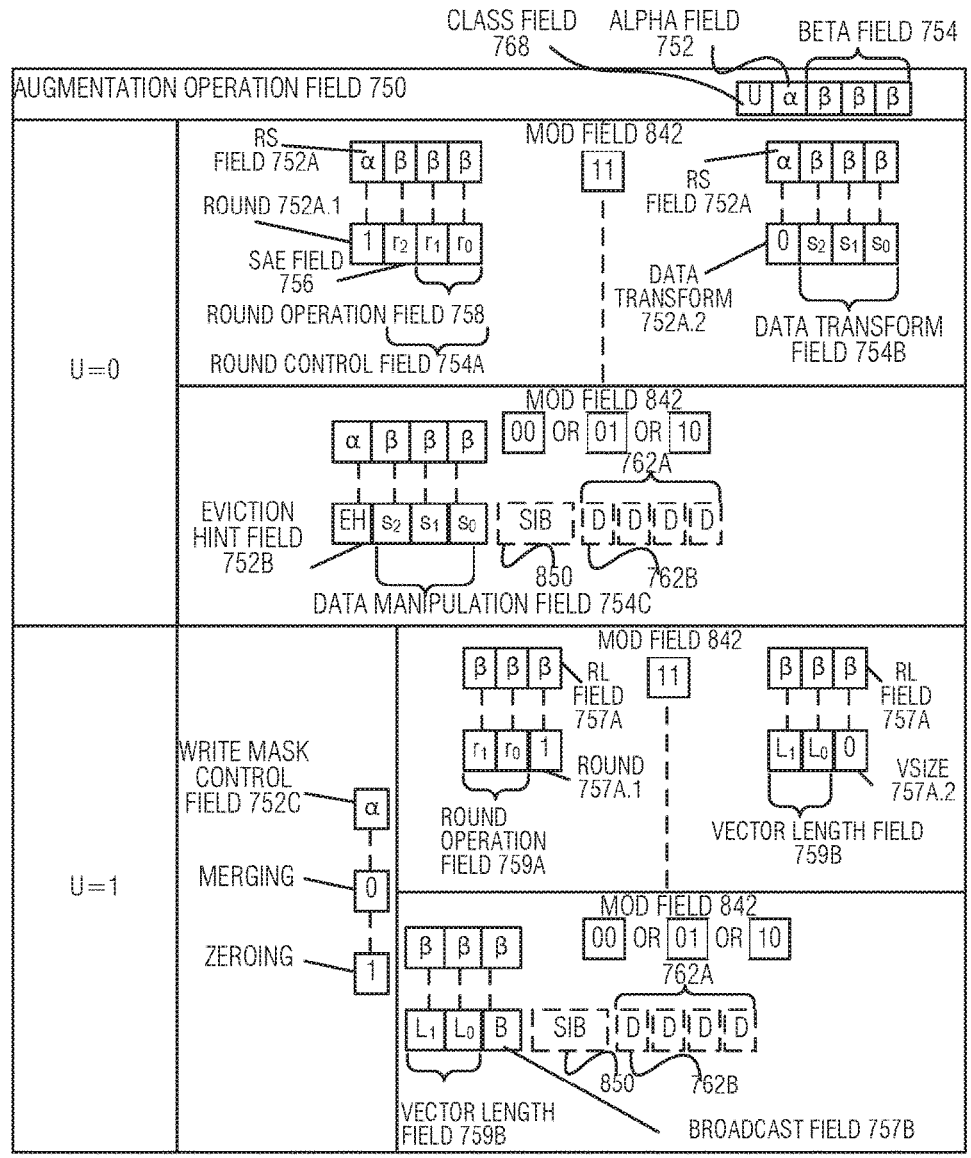

FIG. 8D is a block diagram illustrating the fields of the specific vector friendly instruction format 800 that make up the augmentation operation field 750 according to an embodiment. When the class (U) field 768 contains 0, it signifies EVEX.U0 (class A 768A); when it contains 1, it signifies EVEX.U1 (class B 768B). When U=0 and the MOD field 842 contains 11 (signifying a no memory access operation), the alpha field 752 (EVEX byte 3, bit [7]-EH) is interpreted as the rs field 752A. When the rs field 752A contains a 1 (round 752A.1), the beta field 754 (EVEX byte 3, bits [6:4]-SSS) is interpreted as the round control field 754A. The round control field 754A includes a one bit SAE field 756 and a two bit round operation field 758. When the rs field 752A contains a 0 (data transform 752A.2), the beta field 754 (EVEX byte 3, bits [6:4]-SSS) is interpreted as a three bit data transform field 754B. When U=0 and the MOD field 842 contains 00, 01, or 10 (signifying a memory access operation), the alpha field 752 (EVEX byte 3, bit [7]-EH) is interpreted as the eviction hint (EH) field 752B and the beta field 754 (EVEX byte 3, bits [6:4]-SSS) is interpreted as a three bit data manipulation field 754C.

When U=1, the alpha field 752 (EVEX byte 3, bit [7]-EH) is interpreted as the write mask control (Z) field 752C. When U=1 and the MOD field 842 contains 11 (signifying a no memory access operation), part of the beta field 754 (EVEX byte 3, bit [4]-S0) is interpreted as the RL field 757A; when it contains a 1 (round 757A.1) the rest of the beta field 754 (EVEX byte 3, bit [6-5]-S2-1) is interpreted as the round operation field 759A, while when the RL field 757A contains a 0 (VSIZE 757.A2) the rest of the beta field 754 (EVEX byte 3, bit [6-5]-S2-1) is interpreted as the vector length field 759B (EVEX byte 3, bit [6-5]-L1-0). When U=1 and the MOD field 842 contains 00, 01, or 10 (signifying a memory access operation), the beta field 754 (EVEX byte 3, bits [6:4]-SSS) is interpreted as the vector length field 759B (EVEX byte 3, bit [6-5]-L1-0) and the broadcast field 757B (EVEX byte 3, bit [4]-B).

Register Architecture

Figure 9:
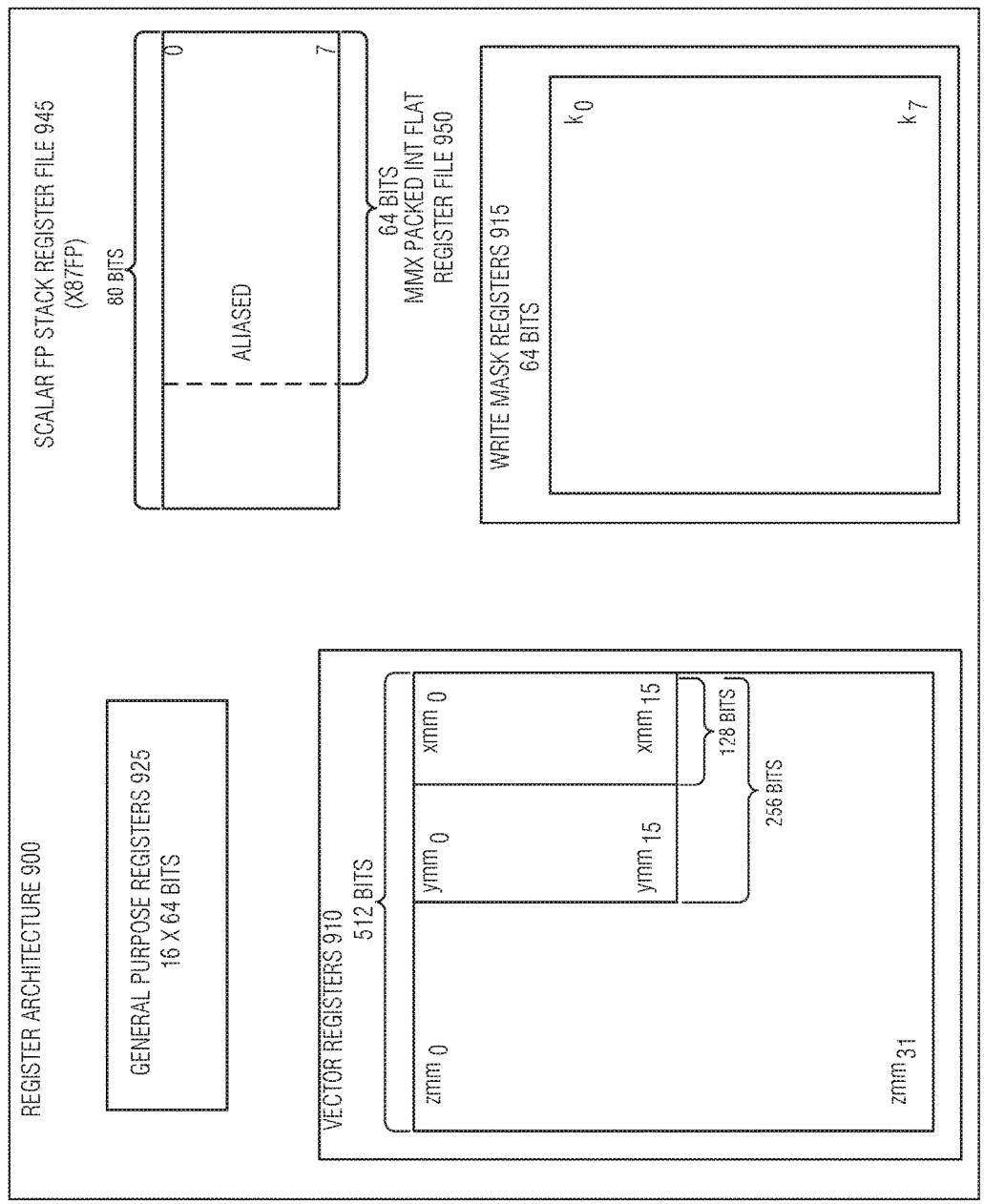
FIG. 9 is a block diagram of a register architecture according to an embodiment.

FIG. 9 is a block diagram of a register architecture 900 according to an embodiment. In the embodiment illustrated, there are 32 vector registers 910 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 800 operates on these overlaid register file as illustrated in the below tables.

| Adjustable Vector Length | Class | Operations | Registers |
| --- | --- | --- | --- |
| Instruction Templates that do not include the vector length field 759B | A (FIG. 7A; U = 0) | 710, 715, 725, 730 | zmm registers (the vector length is 64 byte) |
| | B (FIG. 7B; U = 1) | 712 | zmm registers (the vector length is 64 byte) |
| Instruction templates that do include the vector length field 759B | B (FIG. 7B; U = 1) | 717, 727 | zmm, ymm, or xmm registers (the vector length is 64 byte, 32 byte, or 16 byte) depending on the vector length field 759B |

In other words, the vector length field 759B selects between a maximum length and one or more other shorter lengths, where each such shorter length is half the length of the preceding length; and instructions templates without the vector length field 759B operate on the maximum vector length. Further, in an embodiment, the class B instruction templates of the specific vector friendly instruction format 800 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 915—in the embodiment illustrated, there are 8 write mask registers (k0 through k7), each 64 bits in size. In an alternate embodiment, the write mask registers 915 are 16 bits in size. As previously described, in an embodiment, the vector mask register k0 cannot be used as a write mask; when the encoding that would normally indicate k0 is used for a write mask, it selects a hardwired write mask of 0xFFFF, effectively disabling write masking for that instruction.

General-purpose registers 925—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 945, on which is aliased the MMX packed integer flat register file 950—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments may use wider or narrower registers. Additionally, alternative embodiments may use more, less, or different register files and registers.

Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Core architectures are described next, followed by descriptions of processors and computer architectures.

Core Architectures

In-Order and Out-of-Order Core Block Diagram

FIG. 10A is a block diagram illustrating both an in-order pipeline and a register renaming, out-of-order issue/execution pipeline according to embodiments. FIG. 10B is a block diagram illustrating both an embodiment of an in-order architecture core and a register renaming, out-of-order issue/execution architecture core to be included in a processor according to an embodiment. The solid lined boxes in FIGS. 10A-10B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit 1040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In an embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In an embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In an embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory.

By way of example, the register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In an embodiment, the core 1090 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel@ Hyperthreading technology).

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific In-Order Core Architecture

Figure 11B:
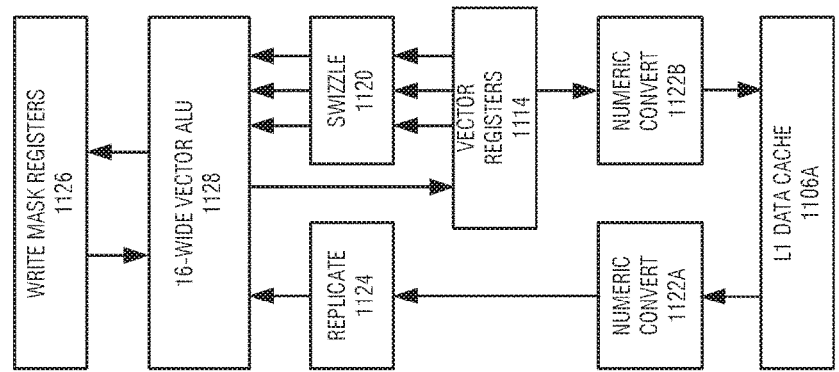
FIGS. 11A-11B illustrate block diagrams of a more specific in-order core architecture, which core would be one of several logic blocks (including other cores of the same type and/or different types) in a chip, according to an embodiment.
Figure 11A:
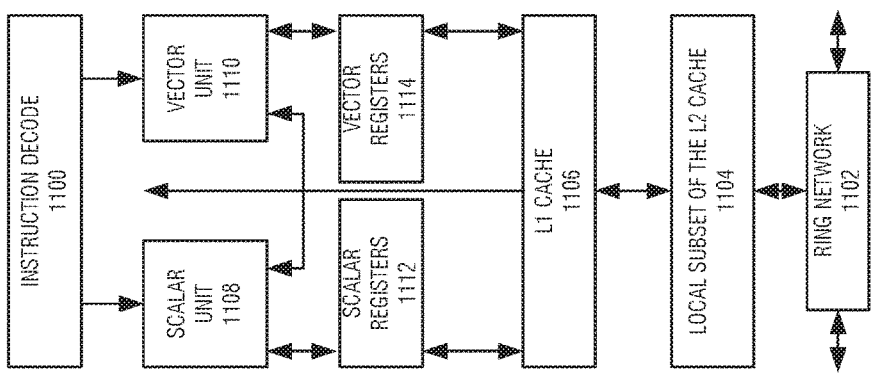

FIGS. 11A-11B illustrate a block diagram of a more specific in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to an embodiment. In an embodiment, an instruction decoder 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 1112 and vector registers 1114) and data transferred between them is written to memory and then read back in from a level 1 (L1) cache 1106, alternative embodiments may use a different approach (e.g., use a single register set or include a communication path that allow data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to an embodiment. FIG. 11B includes an L1 data cache 1106A part of the L1 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Figure 12:
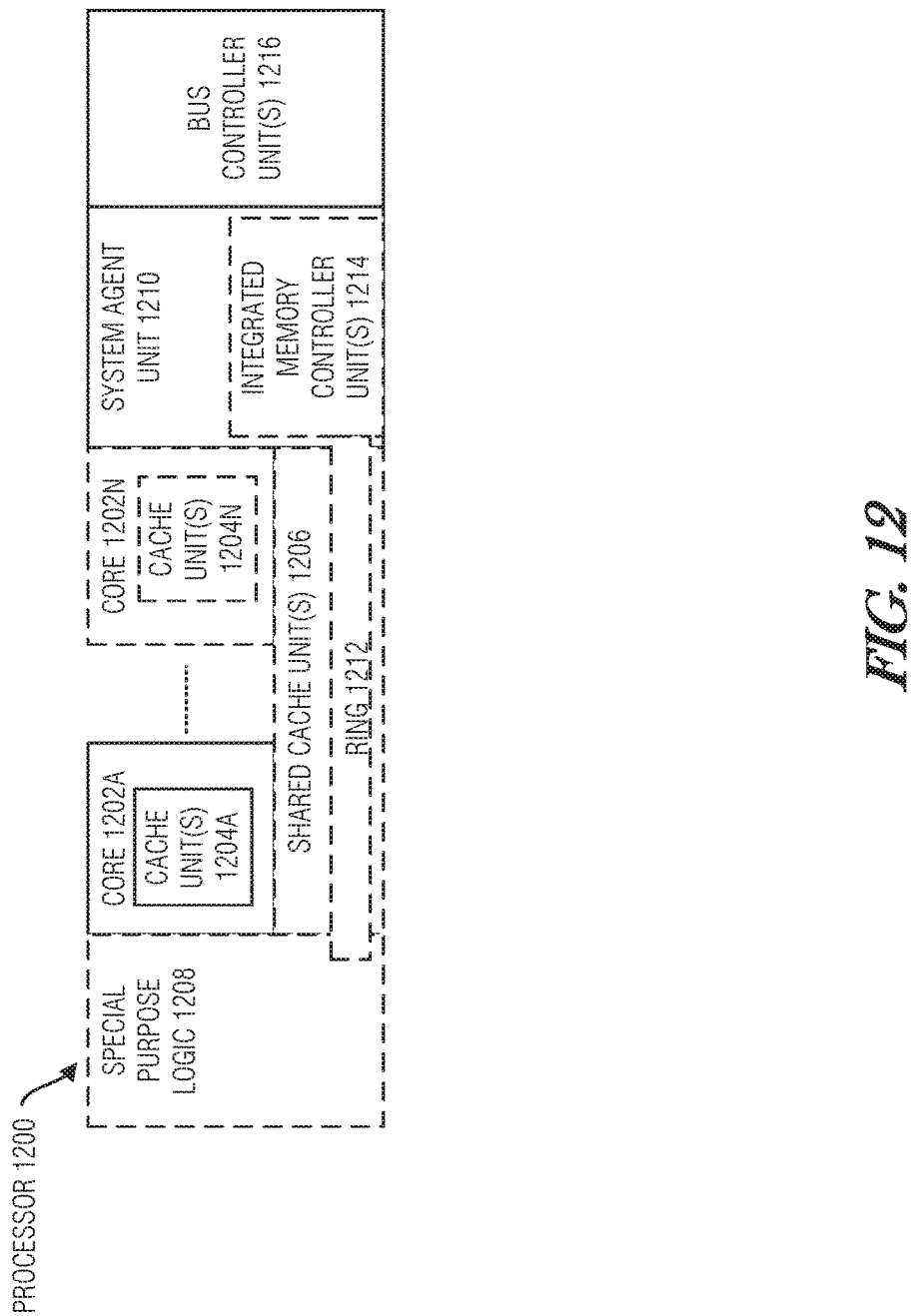
FIG. 12 is a block diagram of a processor that may have more than one core, may have an integrated memory controller, and may have integrated graphics according to an embodiment.

FIG. 12 is a block diagram of a processor 1200 that may have more than one core, may have an integrated memory controller, and may have integrated graphics according to embodiments. The solid lined boxes in FIG. 12 illustrate a processor 1200 with a single core 1202A, a system agent 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208.

Thus, different implementations of the processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the integrated graphics logic 1208, the set of shared cache units 1206, and the system agent unit 1210/integrated memory controller unit(s) 1214, alternative embodiments may use any number of well-known techniques for interconnecting such units. In an embodiment, coherency is maintained between one or more cache units 1204A-N and cores 1202A-N.

In some embodiments, one or more of the cores 1202A-N are capable of multi-threading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of execution the same instruction set, while others may be capable of executing only a subset of that instruction set or a different instruction set.

Computer Architectures

FIGS. 13-16 are block diagrams of computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 13:
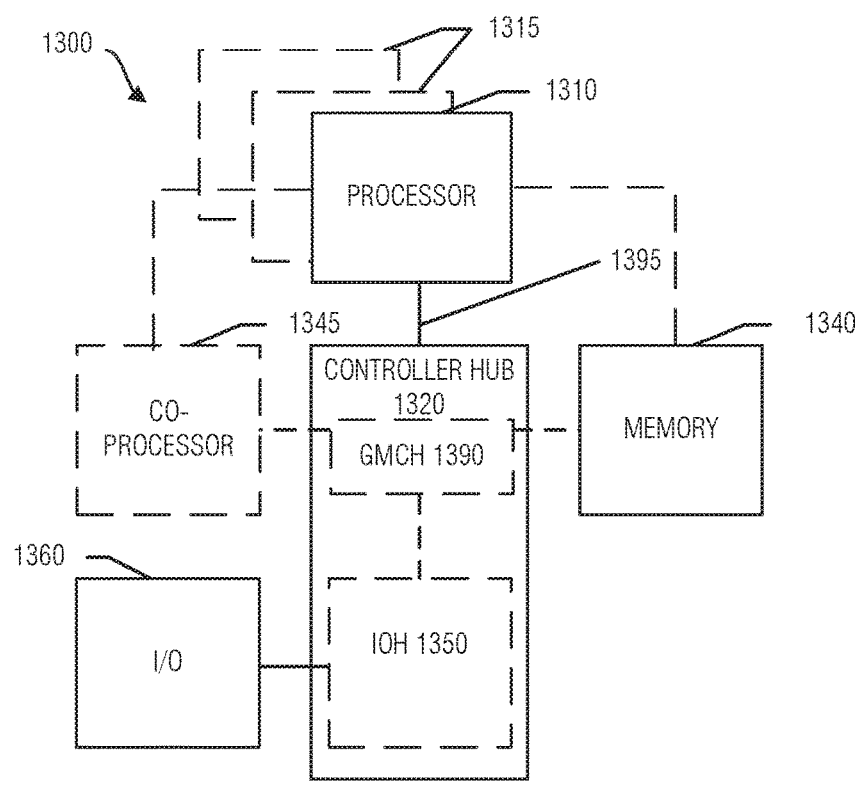
FIGS. 13-16 are block diagrams of computer architectures, according to an embodiment.

Referring now to FIG. 13, shown is a block diagram of a system 1300 according to an embodiment. The system 1300 may include one or more processors 1310, 1315, which are coupled to a controller hub 1320. In an embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 is couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350.

The optional nature of additional processors 1315 is denoted in FIG. 13 with broken lines. Each processor 1310, 1315 may include one or more of the processing cores described herein and may be some version of the processor 1200.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In an embodiment, the coprocessor 1345 is a special-purpose processor, such as, for example, a high-throughput MIC processor, a network or communication processor, compression engine, graphics processor, GPGPU, embedded processor, or the like. In an embodiment, controller hub 1320 may include an integrated graphics accelerator.

There can be a variety of differences between the physical resources 1310, 1315 in terms of a spectrum of metrics of merit including architectural, microarchitectural thermal, power consumption characteristics, and the like.

In an embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
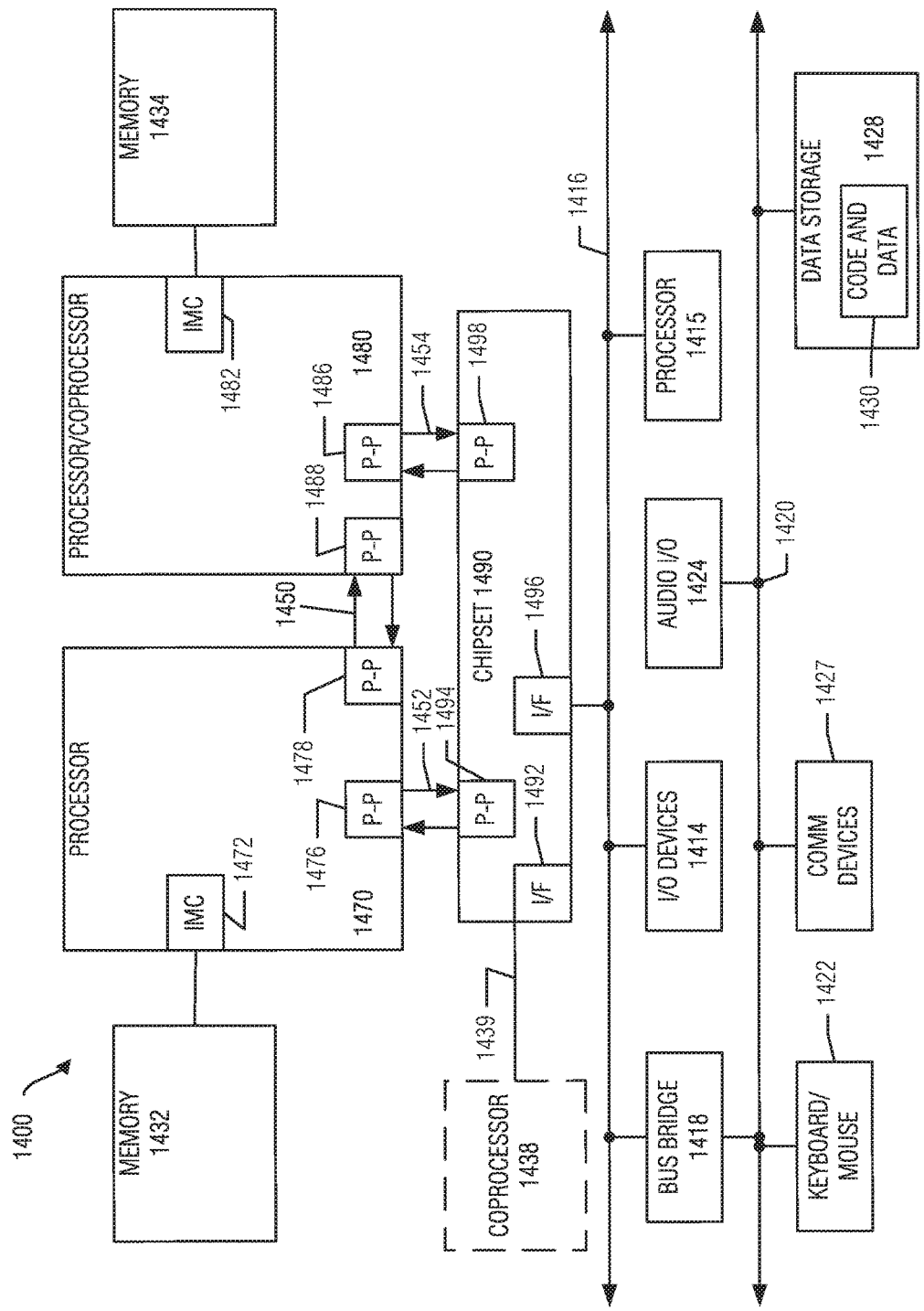

Referring now to FIG. 14, shown is a block diagram of a first more specific system 1400 in accordance with an embodiment. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In an embodiment, processors 1470 and 1480 are respectively processors 1310 and 1315, while coprocessor 1438 is coprocessor 1345. In another embodiment, processors 1470 and 1480 are respectively processor 1310 coprocessor 1345.

Processors 1470 and 1480 are shown including integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 may each exchange information with a chipset 1490 via individual P-P interfaces 1452, 1454 using point to point interface circuits 1476, 1494, 1486, 1498. Chipset 1490 may optionally exchange information with the coprocessor 1438 via a high-performance interface 1439. In an embodiment, the coprocessor 1438 is a special-purpose processor, such as, for example, a high-throughput MIC processor, a network or communication processor, compression engine, graphics processor. GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In an embodiment, first bus 1416 may be a Peripheral Component Interconnect (PCI) bus, or a bus such as a PCI Express bus or another third generation I/O interconnect bus, although the scope of the present invention is not so limited.

As shown in FIG. 14, various I/O devices 1414 may be coupled to first bus 1416, along with a bus bridge 1418 which couples first bus 1416 to a second bus 1420. In an embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1416. In an embodiment, second bus 1420 may be a low pin count (LPC) bus. Various devices may be coupled to a second bus 1420 including, for example, a keyboard and/or mouse 1422, communication devices 1427 and a storage unit 1428 such as a disk drive or other mass storage device which may include instructions/code and data 1430, in an embodiment. Further, an audio I/O 1424 may be coupled to the second bus 1420. Note that other architectures are possible. For example, instead of the point-to-point architecture of FIG. 14, a system may implement a multi-drop bus or other such architecture.

Figure 15:
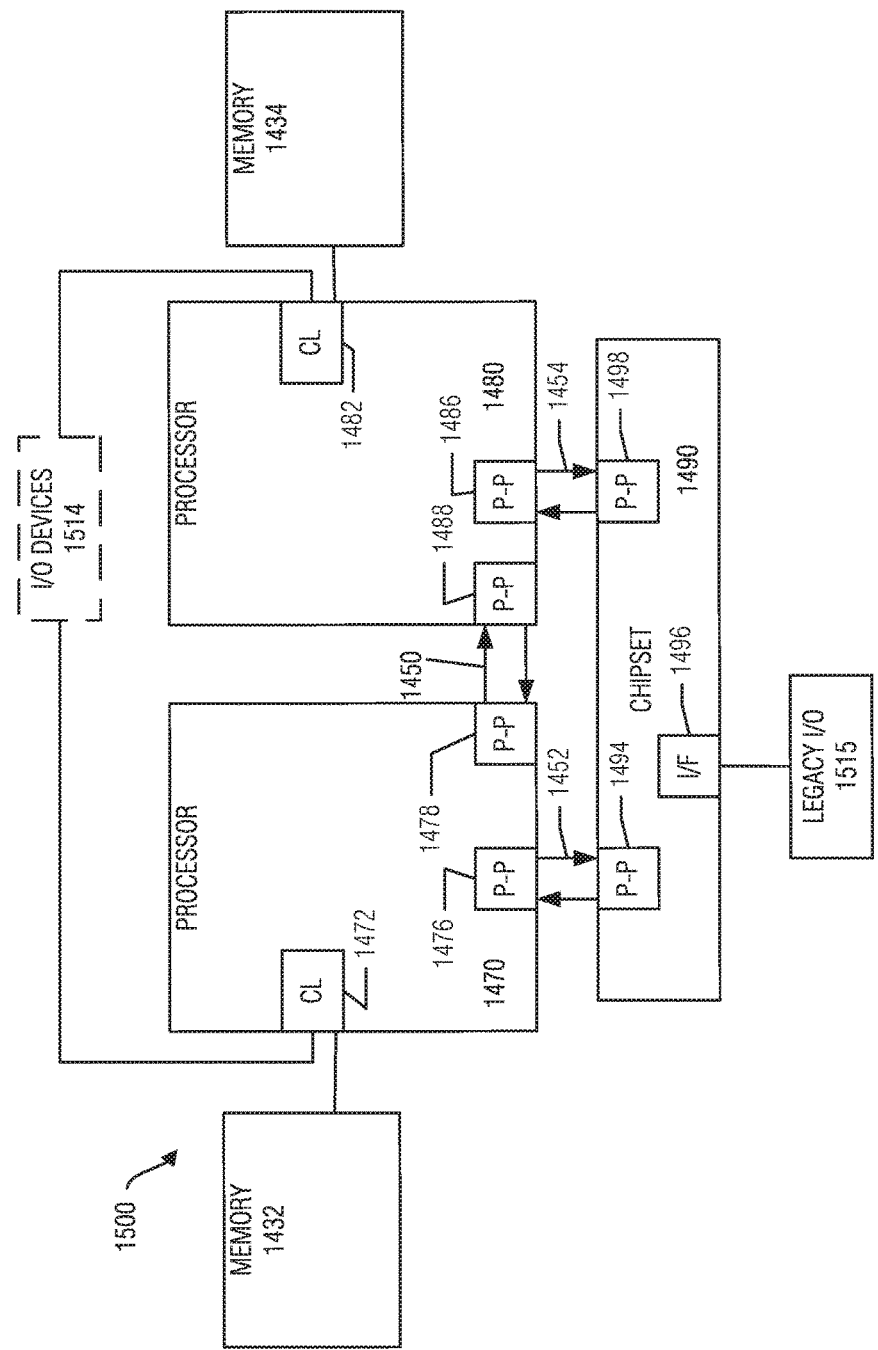

Referring now to FIG. 15, shown is a block diagram of a second more specific system 1500 in accordance with an embodiment. Like elements in FIGS. 14 and 15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but also that I/O devices 1514 are also coupled to the control logic 1472, 1482. Legacy I/O devices 1515 are coupled to the chipset 1490.

Figure 16:
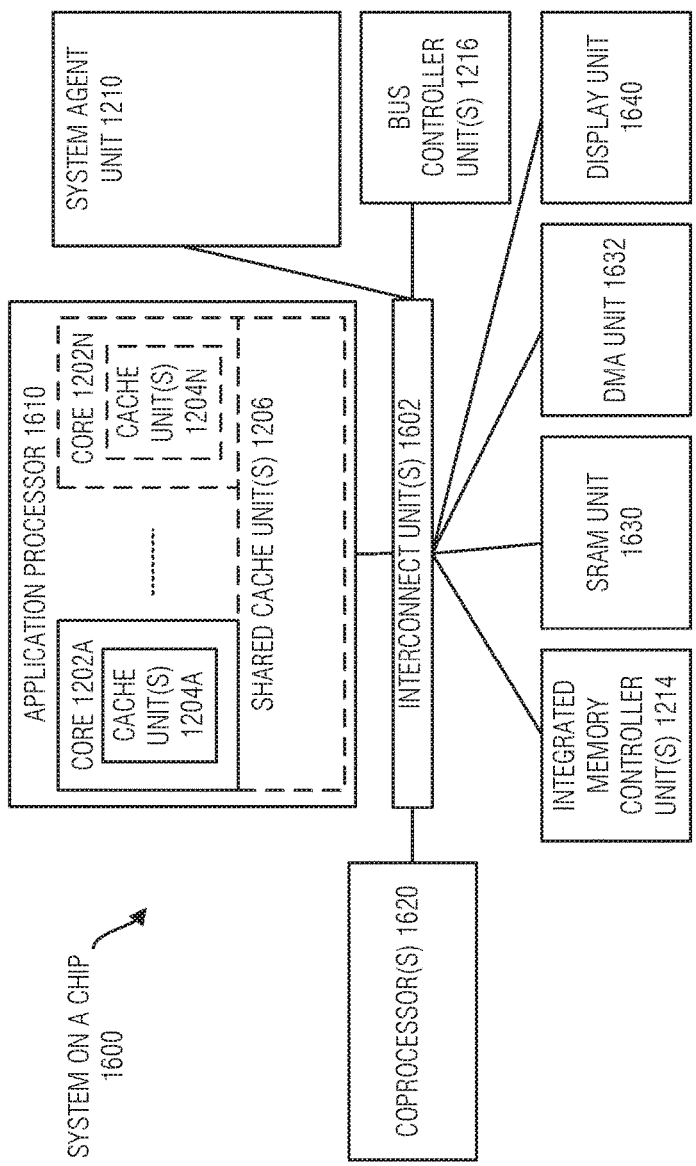

Referring now to FIG. 16, shown is a block diagram of a SoC 1600 in accordance with an embodiment. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 1202A-N with integrated cache units 1204A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In an embodiment, the coprocessor(s) 1620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and nonvolatile memory and/or storage elements), at least one input device, and at least one output device.

Program code, such as code 1430 illustrated in FIG. 14, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 17:
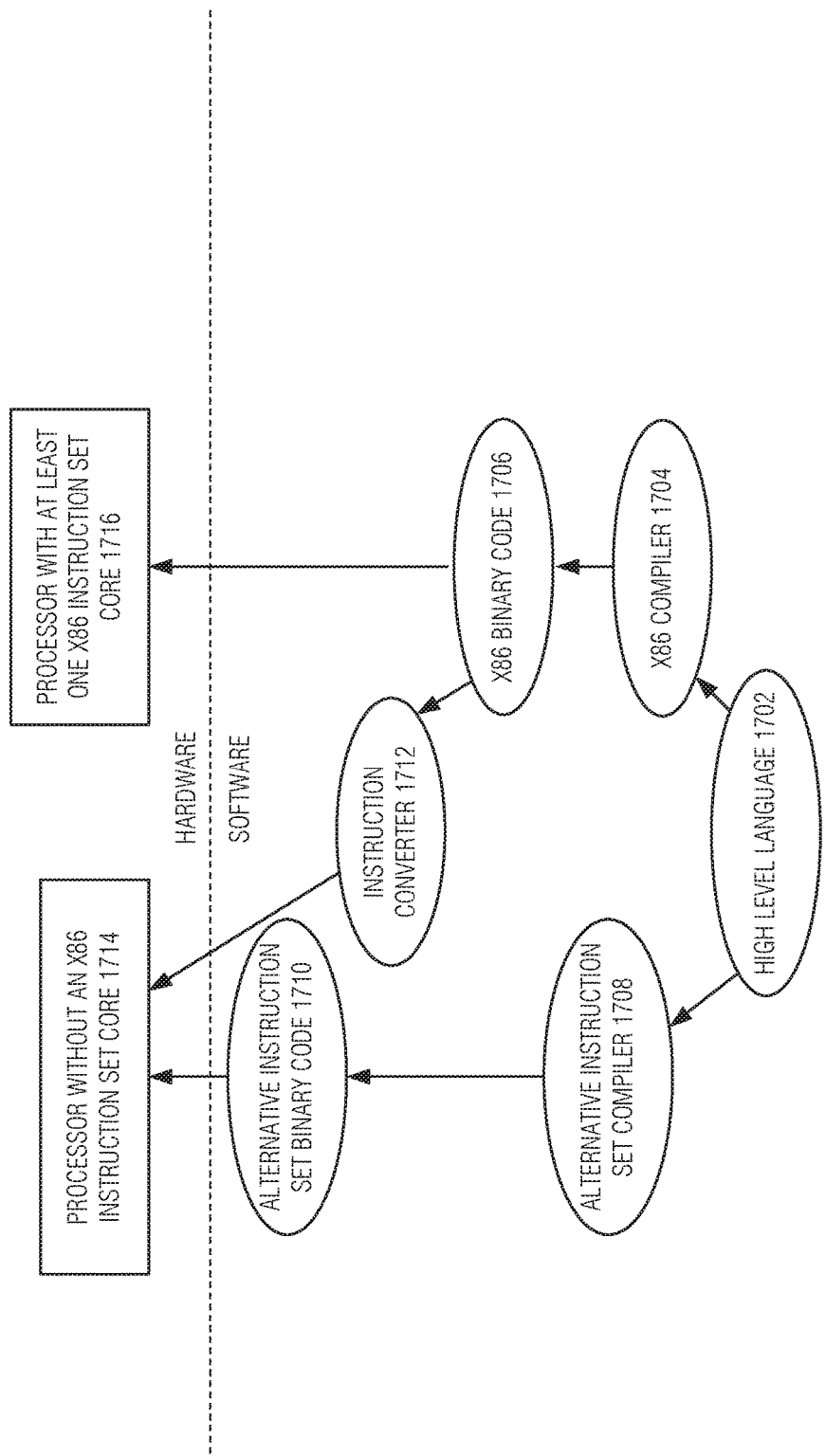
FIG. 17 is a block diagram contrasting the use of a software instruction converter to convert binary instructions in a source instruction set to binary instructions in a target instruction set according to an embodiment.

FIG. 17 is a block diagram contrasting the use of a software instruction converter to convert binary instructions in a source instruction set to binary instructions in a target instruction set according to embodiments. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif, and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

ADDITIONAL NOTES & EXAMPLES

Example 1 is a system for lossless data compression, the system comprising: one or more hash engines to perform a respective hash on an input byte stream, the respective hashes producing respective hash keys for each hash engine of the one or more hash engines, the hash keys mapped to dictionary entries in one or more memory devices to store a corresponding one or more hash tables, each hash table associated with a respective hash engine; the one or more memory devices to store a corresponding one or more compact dictionaries, each compact dictionary associated with a respective hash engine, each compact dictionary including a plurality of words, each word having a specific distance into the compact dictionary, and the one or more compact dictionaries being a subset of a standard dictionary; one or more comparator circuits, each comparator circuit associated with a respective hash engine and compact dictionary, and to compare a word from the respective compact dictionary with the input byte stream hashed by the respective hash engine to create a match score, the one or more comparator circuits to identify a selected word; and an encoder circuit to encode the selected word from the respective compact dictionary, wherein to encode the selected word includes, an operation to determine an index into the standard dictionary of the selected word and use the index in the encoding.

In Example 2, the subject matter of Example 1 includes, wherein the one or more hash engines comprises multiple hash engines to operate in parallel, each of the one or more hash engines to perform their respective hashes on a portion of the input byte stream.

In Example 3, the subject matter of Example 2 includes, wherein each respective hash engine performs their respective hashes on an incrementally larger portion of the input byte stream.

In Example 4, the subject matter of Examples 2-3 includes, wherein the one or more hash engines comprises twenty-one hash engines, and the hash engines are to operate on byte lengths in the range of four to twenty-four from the input byte stream.

In Example 5, the subject matter of Examples 1-4 includes, wherein the one or more memory devices comprises multiple distinct devices to store the one or more hash tables.

In Example 6, the subject matter of Examples 1-5 includes, wherein dictionary entries includes a single entry.

In Example 7, the subject matter of Examples 1-6 includes, wherein dictionary entries includes multiple entries.

In Example 8, the subject matter of Examples 1-7 includes, wherein the one or more memory devices comprises multiple distinct devices to store the one or more compact dictionaries.

In Example 9, the subject matter of Examples 1-8 includes, wherein the one or more compact dictionaries comprises a single dictionary.

In Example 10, the subject matter of Examples 1-9 includes, wherein the one or more compact dictionaries comprises multiple compact dictionaries, each compact dictionary including words of a specific length, the specific length corresponding to a hash engine from the one or more hash engines that is to operate on a string of the specific length.

In Example 11, the subject matter of Examples 1-10 includes, wherein the one or more comparator circuits comprises multiple comparator circuits, each comparator circuit corresponding to a hash engine from the one or more hash engines.

In Example 12, the subject matter of Examples 1-11 includes, wherein the encoder circuit is to select a candidate word from a plurality of candidate words from the one or more comparator circuits.

In Example 13, the subject matter of Examples 1-12 includes, wherein the encoder circuit is to select a candidate word from a plurality of candidate words, the plurality of candidate words provided by a plurality of comparator circuits from the one or more comparator circuits.

In Example 14, the subject matter of Example 13 includes, wherein the encoder circuit is to select the candidate word from the plurality of candidate words by evaluating the plurality of candidate words from longest to shortest, terminating the evaluation when a match is found.

In Example 15, the subject matter of Examples 1-14 includes, wherein the encoder circuit is to select a candidate word from a plurality of candidate words from the one or more comparator circuits by selecting a word having the highest match score of the plurality of candidate words.

In Example 16, the subject matter of Examples 1-15 includes, wherein the standard dictionary is a Brotli dictionary.

Example 17 is a method for lossless data compression, the method comprising: hashing an input byte stream to produce a hash key; identifying dictionary entries in a hash table using the hash key, the hash key associated with a word from a compact dictionary; identifying candidate words from the compact dictionary based on the identified set of dictionary entries, the compact dictionary being a subset of a standard dictionary; determining a best match of candidate words with the input byte stream; and encoding the best match of candidate words as a compressed output of the input byte stream, the encoding including an operation to determine an index into the standard dictionary of the best match and using the index in the encoding operation.

In Example 18, the subject matter of Example 17 includes, wherein hashing the input byte stream is performed by a plurality of hash engines operating in parallel, each of the plurality of hash engines to perform their respective hashes on a portion of the input byte stream.

In Example 19, the subject matter of Example 18 includes, wherein each respective hash engine performs their respective hashes on an incrementally larger portion of the input byte stream.

In Example 20, the subject matter of Examples 18-19 includes, wherein the plurality of hash engines comprises twenty-one hash engines, and the hash engines are to operate on byte lengths in the range of four to twenty-four from the input byte stream.

In Example 21, the subject matter of Examples 18-20 includes, wherein the compact dictionary comprises multiple subset compact dictionaries, each subset compact dictionary including words of a specific length, the specific length corresponding to a hash engine from the plurality of hash engines that is to operate on a string of the specific length.

In Example 22, the subject matter of Examples 17-21 includes, wherein determining the best match comprises: evaluating the plurality of candidate words from longest to shortest; and terminating the evaluation when the best match is found.

In Example 23, the subject matter of Examples 17-22 includes, wherein the standard dictionary is a Brotli dictionary.

Example 24 is at least one machine-readable medium including instructions, which when executed by a machine, cause the machine to perform operations of any of the methods of Examples 17-23.

Example 25 is an apparatus comprising means for performing any of the methods of Examples 17-23.

Example 26 is an apparatus for lossless data compression, the apparatus comprising: means for hashing an input byte stream to produce a hash key; means for identifying dictionary entries in a hash table using the hash key, the hash key associated with a word from a compact dictionary; means for identifying candidate words from the compact dictionary based on the identified set of dictionary entries, the compact dictionary being a subset of a standard dictionary; means for determining a best match of candidate words with the input byte stream; and means for encoding the best match of candidate words as a compressed output of the input byte stream, the encoding including an operation to determine an index into the standard dictionary of the best match and using the index in the encoding operation.

In Example 27, the subject matter of Example 26 includes, wherein the means for hashing the input byte stream is performed by a plurality of hash engines operating in parallel, each of the plurality of hash engines to perform their respective hashes on a portion of the input byte stream.

In Example 28, the subject matter of Example 27 includes, wherein each respective hash engine performs their respective hashes on an incrementally larger portion of the input byte stream.

In Example 29, the subject matter of Examples 27-28 includes, wherein the plurality of hash engines comprises twenty-one hash engines, and the hash engines are to operate on byte lengths in the range of four to twenty-four from the input byte stream.

In Example 30, the subject matter of Examples 27-29 includes, wherein the compact dictionary comprises multiple subset compact dictionaries, each subset compact dictionary including words of a specific length, the specific length corresponding to a hash engine from the plurality of hash engines that is to operate on a string of the specific length.

In Example 31, the subject matter of Examples 26-30 includes, wherein the means for determining the best match comprise: means for evaluating the plurality of candidate words from longest to shortest; and means for terminating the evaluation when the best match is found.

In Example 32, the subject matter of Examples 26-31 includes, wherein the standard dictionary is a Brotli dictionary.

Example 33 is at least one machine-readable medium including instructions for lossless data compression, the instructions when executed by a machine, cause the machine to perform the operations comprising: hashing an input byte stream to produce a hash key; identifying dictionary entries in a hash table using the hash key, the hash key associated with a word from a compact dictionary; identifying candidate words from the compact dictionary based on the identified set of dictionary entries, the compact dictionary being a subset of a standard dictionary; determining a best match of candidate words with the input byte stream; and encoding the best match of candidate words as a compressed output of the input byte stream, the encoding including an operation to determine an index into the standard dictionary of the best match and using the index in the encoding operation.

In Example 34, the subject matter of Example 33 includes, wherein hashing the input byte stream is performed by a plurality of hash engines operating in parallel, each of the plurality of hash engines to perform their respective hashes on a portion of the input byte stream.

In Example 35, the subject matter of Example 34 includes, wherein each respective hash engine performs their respective hashes on an incrementally larger portion of the input byte stream.

In Example 36, the subject matter of Examples 34-35 includes, wherein the plurality of hash engines comprises twenty-one hash engines, and the hash engines are to operate on byte lengths in the range of four to twenty-four from the input byte stream.

In Example 37, the subject matter of Examples 34-36 includes, wherein the compact dictionary comprises multiple subset compact dictionaries, each subset dictionary including words of a specific length, the specific length corresponding to a hash engine from the plurality of hash engines that is to operate on a string of the specific length.

In Example 38, the subject matter of Examples 33-37 includes, wherein determining the best match comprises: evaluating the plurality of candidate words from longest to shortest; and terminating the evaluation when the best match is found.

In Example 39, the subject matter of Examples 33-38 includes, wherein the standard dictionary is a Brotli dictionary.

Example 44 is at least one machine-readable medium including instructions that, when executed by a processor subsystem, cause the processor subsystem to perform operations to implement of any of Examples 1-39.

Example 45 is an apparatus comprising means to implement of any of Examples 1-39.

Example 46 is a system to implement of any of Examples 1-39.

Example 47 is a method to implement of any of Examples 1-39.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B." "B but not A." and "A and B." unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third." etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A system for lossless data compression, the system comprising:

one or more hash engines to perform a respective hash on an input byte stream, the respective hashes producing respective hash keys for each hash engine of the one or more hash engines, the hash keys mapped to dictionary entries in one or more memory devices to store a corresponding one or more hash tables, each hash table associated with a respective hash engine;

the one or more memory devices to store a corresponding one or more compact dictionaries, each compact dictionary associated with a respective hash engine, each compact dictionary including a plurality of words, each word having a specific distance into the compact dictionary, and the one or more compact dictionaries being a subset of a standard dictionary;

one or more comparator circuits, each comparator circuit associated with a respective hash engine and compact dictionary, and to compare a word from the respective compact dictionary with the input byte stream hashed by the respective hash engine to create a match score, the one or more comparator circuits to identify a selected word; and an encoder circuit to encode the selected word from the respective compact dictionary, wherein to encode the selected word includes an operation to determine an index into the standard dictionary of the selected word and use the index in the encoding.

2. The system of claim 1, wherein the one or more hash engines comprises multiple hash engines to operate in parallel, each of the one or more hash engines to perform their respective hashes on a portion of the input byte stream.

3. The system of claim 2, wherein each respective hash engine performs their respective hashes on an incrementally larger portion of the input byte stream.

4. The system of claim 2, wherein the one or more hash engines comprises twenty-one hash engines, and the hash engines are to operate on byte lengths in the range of four to twenty-four from the input byte stream.

5. The system of claim 1, wherein the one or more memory devices comprises multiple distinct devices to store the one or more hash tables.

6. The system of claim 1, wherein dictionary entries includes a single entry.

7. The system of claim 1, wherein dictionary entries includes multiple entries.

8. The system of claim 1, wherein the one or more memory devices comprises multiple distinct devices to store the one or more compact dictionaries.

9. The system of claim 1, wherein the one or more compact dictionaries comprises a single dictionary.

10. The system of claim 1, wherein the one or more compact dictionaries comprises multiple compact dictionaries, each compact dictionary including words of a specific length, the specific length corresponding to a hash engine from the one or more hash engines that is to operate on a string of the specific length.

11. The system of claim 1, wherein the one or more comparator circuits comprises multiple comparator circuits, each comparator circuit corresponding to a hash engine from the one or more hash engines.

12. The system of claim 1, wherein the encoder circuit is to select a candidate word from a plurality of candidate words from the one or more comparator circuits.

13. The system of claim 1, wherein the encoder circuit is to select a candidate word from a plurality of candidate words, the plurality of candidate words provided by a plurality of comparator circuits from the one or more comparator circuits.

14. The system of claim 13, wherein the encoder circuit is to select the candidate word from the plurality of candidate words by evaluating the plurality of candidate words from longest to shortest, terminating the evaluation when a match is found.

15. The system of claim 1, wherein the encoder circuit is to select a candidate word from a plurality of candidate words from the one or more comparator circuits by selecting a word having the highest match score of the plurality of candidate words.

16. The system of claim 1, wherein the standard dictionary is a Brotli dictionary.

17. A method for lossless data compression, the method comprising:
   hashing an input byte stream to produce a hash key;
   identifying dictionary entries in a hash table using the hash key, the hash key associated with a word from a compact dictionary;
   identifying candidate words from the compact dictionary based on the identified set of dictionary entries, the compact dictionary being a subset of a standard dictionary;
   determining a best match of candidate words with the input byte stream; and
   encoding the best match of candidate words as a compressed output of the input byte stream, the encoding including an operation to determine an index into the standard dictionary of the best match and using the index in the encoding operation.

18. The method of claim 17, wherein hashing the input byte stream is performed by a plurality of hash engines operating in parallel, each of the plurality of hash engines to perform their respective hashes on a portion of the input byte stream.

19. The method of claim 18, wherein each respective hash engine performs their respective hashes on an incrementally larger portion of the input byte stream.

20. The method of claim 18, wherein the plurality of hash engines comprises twenty-one hash engines, and the hash engines are to operate on byte lengths in the range of four to twenty-four from the input byte stream.

21. The method of claim 18, wherein the compact dictionary comprises multiple subset compact dictionaries, each subset compact dictionary including words of a specific length, the specific length corresponding to a hash engine from the plurality of hash engines that is to operate on a string of the specific length.

22. The method of claim 17, wherein determining the best match comprises:
   evaluating the plurality of candidate words from longest to shortest; and
   terminating the evaluation when the best match is found.

23. The method of claim 17, wherein the standard dictionary is a Broth dictionary.

24. At least one machine-readable medium including instructions for lossless data compression, the instructions when executed by a machine, cause the machine to perform the operations comprising:
   hashing an input byte stream to produce a hash key;
   identifying dictionary entries in a hash table using the hash key, the hash key associated with a word from a compact dictionary;
   identifying candidate words from the compact dictionary based on the identified set of dictionary entries, the compact dictionary being a subset of a standard dictionary;
   determining a best match of candidate words with the input byte stream; and
   encoding the best match of candidate words as a compressed output of the input byte stream, the encoding including an operation to determine an index into the standard dictionary of the best match and using the index in the encoding operation.

25. The machine-readable medium of claim 24, wherein hashing the input byte stream is performed by a plurality of hash engines operating in parallel, each of the plurality of hash engines to perform their respective hashes on a portion of the input byte stream.

* * * * *

UNITED STATES PATENT AND TRADEMARK OFFICE
CERTIFICATE OF CORRECTION

PATENT NO. : 10,128,868 B1  
APPLICATION NO. : 15/858964  
DATED : November 13, 2018  
INVENTOR(S) : Gopal et al.

Page 1 of 1

It is certified that error appears in the above-identified patent and that said Letters Patent is hereby corrected as shown below:

On the Title Page

In item (72), in "Inventors", in Column 1, Line 3, delete "Franklink" and insert --Franklin-- therefor In the Claims In Column 36, Line 15, in Claim 23, delete "Broth" and insert --Brotli-- therefor Signed and Sealed this
Twenty-fourth Day of March, 2020

Andrei Iancu
*Director of the United States Patent and Trademark Office*